United States Patent
Loh et al.

(10) Patent No.: US 10,297,306 B2
(45) Date of Patent: *May 21, 2019

(54) VOLATILE MEMORY DEVICE AND ELECTRONIC DEVICE COMPRISING REFRESH INFORMATION GENERATOR, INFORMATION PROVIDING METHOD THEREOF, AND REFRESH CONTROL METHOD THEREOF

(71) Applicant: Samsung Electronics Co., Ltd., Suwon-si, Gyeonggi-do (KR)

(72) Inventors: Yanggyoon Loh, Hwaseong-si (KR); Hoyoung Song, Hwaseong-si (KR); Sangwoong Shin, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/900,070

(22) Filed: Feb. 20, 2018

(65) Prior Publication Data

US 2018/0174641 A1 Jun. 21, 2018

Related U.S. Application Data

(63) Continuation of application No. 15/413,907, filed on Jan. 24, 2017, now Pat. No. 9,928,895.

(30) Foreign Application Priority Data

Feb. 3, 2016 (KR) .................. 10-2016-0013631
Jul. 11, 2016 (KR) .................. 10-2016-0087630

(51) Int. Cl.
*G11C 11/06* (2006.01)
*G11C 11/406* (2006.01)
(Continued)

(52) U.S. Cl.
CPC ...... *G11C 11/40615* (2013.01); *G06F 3/0604* (2013.01); *G06F 3/0659* (2013.01);
(Continued)

(58) Field of Classification Search
CPC ........ G11C 11/40615; G11C 11/40618; G11C 11/4096; G11C 11/40611; G11C 11/4087;
(Continued)

(56) References Cited

U.S. PATENT DOCUMENTS 6,744,684 B2 6/2004 Arimoto et al.
7,869,297 B2 1/2011 Kim
(Continued)

FOREIGN PATENT DOCUMENTS

KR 20030082365 A 10/2003

*Primary Examiner* — Thong Q Le
(74) *Attorney, Agent, or Firm* — Harness, Dickey & Pierce, PLC

(57) ABSTRACT

A volatile memory device includes a refresh controller configured to control a hidden refresh operation performed on a first portion of memory cells while a valid operation is performed on a second portion of the memory cells. The volatile memory device is configured to perform a regular refresh operation in response to receiving a refresh command. The refresh controller is configured to generate refresh information using a performance indicator of the hidden refresh operation during a first part of a reference time. The volatile memory device is configured to perform a desired number of the regular refresh operation during a remaining part of the reference time based on the refresh information. The desired number of the regular refresh operation is an integer based on a difference between a target number of refresh operations during the reference time and a count value of the hidden refresh operation during the reference time.

20 Claims, 18 Drawing Sheets

(51) Int. Cl.
*G06F 3/06* (2006.01)
*G11C 11/408* (2006.01)
*G11C 11/4091* (2006.01)
*G11C 11/4096* (2006.01)

(52) U.S. Cl.
CPC ........ *G06F 3/0673* (2013.01); *G11C 11/4087* (2013.01); *G11C 11/4091* (2013.01); *G11C 11/4096* (2013.01); *G11C 11/40611* (2013.01); *G11C 11/40618* (2013.01)

(58) Field of Classification Search
CPC ........ G11C 11/4091; G11C 2029/0409; G11C 29/52; G11C 11/223; G11C 11/2275; G11C 11/2277; G11C 11/40603; G11C 11/40607; G11C 11/40626; G11C 11/4093
USPC .................................. 365/148, 189.05, 222
See application file for complete search history.

(56) References Cited

U.S. PATENT DOCUMENTS

| | | |
|---|---|---|
| 8,151,044 B2 | 4/2012 | Proesbsting |
| 8,638,626 B2 | 1/2014 | Yang et al. |
| 8,817,566 B2 | 8/2014 | Shin et al. |
| 8,873,326 B2 | 10/2014 | Lee |
| 9,928,895 B2 * | 3/2018 | Loh .................. G11C 11/40611 |
| 2013/0254475 A1 | 9/2013 | Perego et al. |
| 2015/0003172 A1 * | 1/2015 | Kim .................. G11C 11/40607 |
| | | 365/189.05 |

* cited by examiner

VOLATILE MEMORY DEVICE AND ELECTRONIC DEVICE COMPRISING REFRESH INFORMATION GENERATOR, INFORMATION PROVIDING METHOD THEREOF, AND REFRESH CONTROL METHOD THEREOF

CROSS-REFERENCE TO RELATED APPLICATIONS

The present application is a continuation of U.S. application Ser. No. 15/413,907, filed on Jan. 24, 2017, which claims priority under 35 U.S.C. § 119 to Korean Patent Provisional Application No. 10-2016-0013631 filed Feb. 3, 2016, and Korean Patent Application No. 10-2016-0087630 filed Jul. 11, 2016, in the Korean Intellectual Property Office. The entire contents of each of the above-referenced applications are hereby incorporated by reference.

BACKGROUND

Some example embodiments relate to a semiconductor memory device, and in particular, to a volatile memory device and an electronic device including a refresh information generator, an information providing method thereof, and/or a refresh control method thereof.

A semiconductor memory device refers to a device that stores data under control of a host device, such as a computer, a smartphone, a smart pad, etc. The semiconductor memory device includes a volatile memory device such as a dynamic random access memory (DRAM) or a static RAM (SRAM). As an example of the volatile memory device, a DRAM device performs a refresh operation periodically such that data stored therein is not lost. In general, to limit and/or prevent collision of data in the refresh operation, a memory device does not receive a write or read command.

To provide a high-capacity memory to a host, in general, the volatile memory device may be implemented in the form of a memory module. The refresh operation that is performed on a plurality of volatile memory devices included in the memory module is managed by the host and a memory controller.

However, according to a tendency for the high capacity and high integration of the memory module and the memory device, it becomes complicated for the host (and/or memory controller) to control the refresh operation for each memory device. Also, if the number of refresh commands increases, as described above, the efficiency in which data is processed may decrease because the memory device does not receive a write or read command.

SUMMARY

Inventive concepts relate to a volatile memory device that includes a refresh information generator for generating refresh information that relates to a refresh execution state of the volatile memory device, an electronic device that includes the volatile memory device, a method of providing the refresh information, and a refresh control method of the volatile memory device and/or electronic device.

In some example embodiments, a memory system includes a volatile memory device and a memory controller connected to the volatile memory device. The volatile memory device includes a refresh controller connected to memory cells. The volatile memory device is configured to perform a hidden refresh operation on a first portion of the memory cells while the volatile memory device performs a valid operation on a second portion of the memory cells. The refresh controller is configured to generate refresh information based on a number of times the volatile memory device performs the hidden refresh operation during a reference time. The memory controller is configured to control a schedule for a regular refresh operation based on the refresh information. The memory controller is configured to control the volatile memory device to perform the regular refresh operation according to the schedule.

In some example embodiments, a memory system includes a volatile memory device and a memory controller connected to the volatile memory device. The volatile memory device includes a refresh controller connected to memory cells. The volatile memory device is configured to perform a hidden refresh operation on a first portion of the memory cells while the volatile memory device performs a valid operation on a second portion of the memory cells. The refresh controller is configured to generate refresh information based on a number of times the volatile memory device performs the hidden refresh operation. The refresh controller is configured to update the refresh information if the volatile memory device performs the hidden refresh operation. The memory controller is configured to control a schedule for a regular refresh operation during a remaining portion of a reference time based on the refresh information. The memory controller is configured to control the volatile memory device to perform the regular refresh operation according to the schedule.

In some example embodiments, a memory system includes a volatile memory device and a memory controller connected to the volatile memory device. The volatile memory device includes a refresh controller connected to memory cells. The volatile memory device is configured to perform a hidden refresh operation on a first portion of the memory cells while the volatile memory device performs a valid operation on a second portion of the memory cells. The refresh controller is configured to generate refresh information based on a number of times the volatile memory device performs the hidden refresh operation during a reference time. The memory controller is configured to generate a refresh command based on the refresh information to perform a regular refresh operation in the volatile memory device.

In some example embodiments, a memory system includes a volatile memory device and a memory controller. The volatile memory device includes a refresh controller connected to memory cells. The volatile memory device is configured to perform a first refresh operation on a first portion of the memory cells while the volatile memory device performs a valid operation on a second portion of the memory cells. The volatile memory device is configured to perform a second refresh operation in response to a refresh command from the memory controller. The refresh controller being configured to generate refresh information using a performance indicator of the first refresh operation during a first part of a reference time. The memory controller is configured to schedule the second refresh operation a desired number of times during a remaining part of the reference time based on the refresh information. The memory controller is configured to control the volatile memory device to perform the second refresh operation according to the schedule.

According to some example embodiments, a volatile memory device includes a refresh controller connected to memory cells. The refresh controller is configured to control a hidden refresh operation performed on a first portion of the memory cells while the volatile memory device performs a valid operation on a second portion of the memory cells. The refresh controller is configured to generate refresh information based on a number of times the volatile memory device performs the hidden refresh operation during a reference time. The volatile memory device is configured to perform N regular refresh operations during the reference time in response to receiving N refresh commands from a host. N is an integer corresponding to a difference between a target number of refresh operations during the reference time and the number of times the volatile memory device performs the hidden refresh operation during the reference time.

According to some example embodiments, a volatile memory device includes a refresh controller connected to memory cells. The volatile memory device is configured to perform a hidden refresh operation on a first portion of the memory cells while the volatile memory device performs a valid operation on a second portion of the memory cells. The refresh controller is configured to generate refresh information to be submitted to a memory controller. The refresh information is based on a number of times the volatile memory device performs the hidden refresh operation during a reference time.

According to some example embodiments, a volatile memory device includes a refresh controller connected to memory cells. The refresh controller is configured to control a hidden refresh operation performed on a first portion of the memory cells while the volatile memory device performs a valid operation on a second portion of the memory cells. The volatile memory device is configured to perform a regular refresh operation in response to a refresh command from an external memory controller. The refresh controller is configured to generate refresh information using a performance indicator of the hidden refresh operation during a first part of the reference time. The volatile memory device is configured to perform a desired number of the regular refresh operation during a remaining part of the reference time based on the refresh information. The desired number of the regular refresh operation is an integer corresponding to a difference between a target number of refresh operations during the reference time and a refresh metric including the number of times the volatile memory device performs the hidden refresh operation during the reference time.

According to some example embodiments, a volatile memory device includes a refresh controller connected to memory cells. The refresh controller is configured to control a first refresh operation performed on a first portion of the memory cells while the volatile memory device performs a valid operation on a second portion of the memory cells. The volatile memory device is configured to perform a second refresh operation in response to a refresh command from an external memory controller. The refresh controller is configured to generate refresh information based on a performance indicator of the first refresh operation during a first part of the reference time. The volatile memory device is configured to perform a desired number of the second refresh operation during a remaining part of the reference time based on a number of times the volatile memory device receives the refresh command from the external controller during the remaining part of the reference time.

According to some example embodiments, a method of operating a memory system including a volatile memory device connected to a memory controller is provided. The volatile memory device includes memory cells connected to a refresh controller. The method includes performing N hidden refresh operations on the memory cells during a reference time, generating refresh information using the refresh controller based on the N hidden refresh operations and a number of regular refresh operations performed during a first part of the reference time, and performing M additional regular refresh operations during a remaining portion of the reference time using the memory controller based on the refresh information. M and N are integers.

According to some example embodiments, a method of operating a memory system including a volatile memory device connected to a memory controller is provided. The volatile memory device includes memory cells connected to a refresh controller. The method includes performing at least one hidden refresh operation on the memory cells during a reference time, generating refresh information using the refresh controller based on a count number of the at least one hidden refresh operation and a number of regular refresh operations performed during the reference time, and performing M additional regular refresh operations during a remaining portion of the reference time using the memory controller based on the refresh information. M corresponds to a difference between a target number of refresh operations and both the count number of the least one hidden refresh operation and the number of regular refresh operations during the reference time.

According to some example embodiments, a method of operating a memory system including a volatile memory device connected to a memory controller is provided. The volatile memory device includes memory cells connected to a refresh controller. The method includes performing a first refresh operation on a first portion of the memory cells and a valid operation on a second portion of the memory cells at least one time during a first part of the reference time, generating refresh information using the refresh controller based on a performance indicator of the first refresh operation during the first part of the reference time. providing the refresh information to the memory controller, using the memory controller to schedule a second refresh operation a desired number of times during a remaining part of the reference time, based on the refresh information, and performing the second refresh operation on the volatile memory device during the remaining part of the reference time according to the schedule.

According to some example embodiments, a memory controller includes a host interface configured to receive a data request from a host, a memory interface configured to provide commands to a volatile memory device and to receive refresh information generated from the volatile memory device, and a refresh manager. The refresh information includes one of a performance indicator of at least one hidden refresh operation the volatile memory device performed during a first part of a reference time; and the performance indicator of the at least one hidden refresh operation the volatile memory device performed during the first part of the reference time and a performance indicator of at least one regular refresh operation that the memory device performed during the first part of the reference time. The refresh manager is configured to schedule the regular refresh operation a desired number of times during a remaining part of the reference time based on the refresh information. The refresh manager is configured to control the volatile memory device to perform the regular refresh operation according to the schedule. The desired number of times is based on a difference between a reference value and count values of the at least one hidden refresh operation and the at least one regular refresh operation performed during the first part of the reference time, respectively.

DETAILED DESCRIPTION

Below, some example embodiments of inventive concept are described in detail and clearly to such an extent that an ordinary one in the art may implement inventive concepts.

Figure 1:
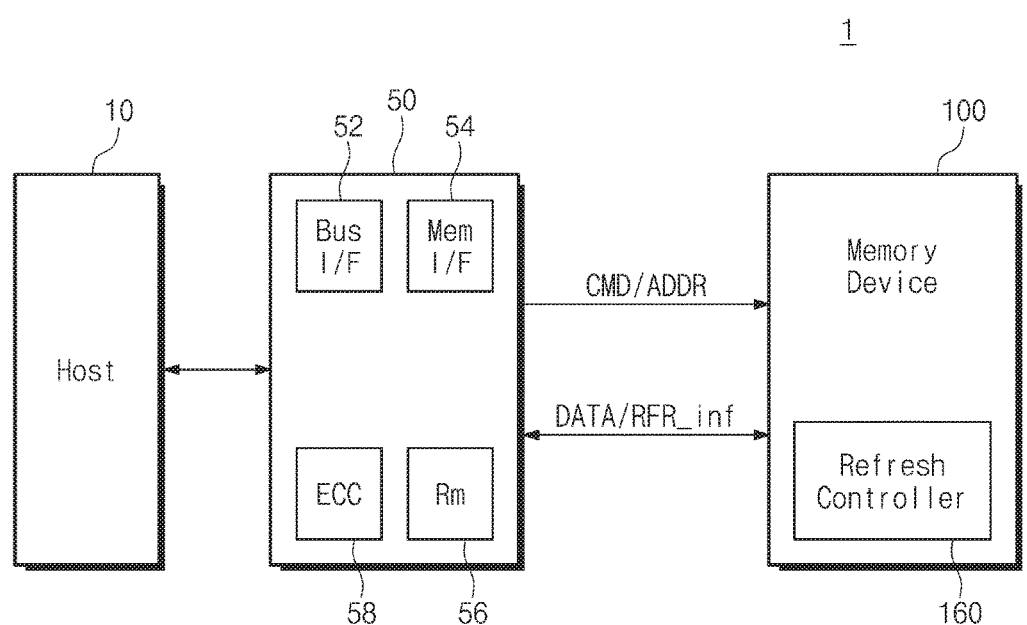
FIG. 1 is a drawing illustrating an electronic device including a memory device according to some example embodiments of inventive concepts.

FIG. 1 is a drawing illustrating an electronic device including a memory device according to some example embodiments of inventive concepts. Referring to FIG. 1, an electronic device 1 may include a host 10, a memory controller 50, and a memory device 100. For example, the electronic device 1 may be a single system including the host 10, the memory controller 50, and the memory device 100. Alternatively, the host 10, the memory controller 50, and/or the memory device 100 of the electronic device 1 may be implemented with separate devices, respectively. For example, the host 10 may be external to the memory controller 50 and the memory device 100. The memory controller 50 may be external to the host 10 and connected to the memory device 100 through a system bus (not shown). Alternatively, the memory controller 50 may be external to the memory device 100 and a portion of the host 10.

The memory controller 50 may be connected to the memory device 50. The memory controller 50 may include a host interface 52 (e.g., bus interface), a memory interface 54, an error correction circuit (ECC) 58 and a refresh manager 56. The memory controller 50 may be configured to control the memory device 100 according to requests and/or data from the host 10. The memory controller 50 may receive a data request (e.g., read request, write request) and/or data from the host 10. The memory controller 50 may receive the data request from the host 10 through the host interface 52 and provide commands to the volatile memory device 100 and/or receive refresh information from the volatile memory device 100 through the memory interface 54. The ECC circuit 58 may perform an ECC operation on read data from the memory device 100 and/or write data to the memory device 100 to correct a bit error. The refresh manager 56 may be configured to provide commands to the memory device 100 and/or receive refresh information RFR_inf from the memory device 100. The memory controller may provide commands CMD, addresses ADDR, and data DATA to the memory device 100, and may receive refresh information RFR_inf and data DATA from the memory device 100.

The host 10 may be a processor circuit including a general-purpose processor or an application processor or an electronic device. Alternatively, the host 10 may be the following computing device including one or more processors: a personal computer, a peripheral device, a digital camera, personal digital assistant (PDA), a portable media player (PMP), a smartphone, or a wearable device. However, inventive concepts are not limited thereto.

The memory device 100 may store data provided from the host 10 or data to be provided to the host 10. The memory 100 may be implemented with all storage mediums including a volatile memory. For example, the memory device 100 may include a DRAM, a SRAM, a thyristor RAM (TRAM), a zero capacitor RAM (Z-RAM), a twin transistor RAM (TTRAM), a magnetoresistive RAM (MRAM), etc. Example embodiments of inventive concepts may be also applied to all storage mediums including a volatile memory. For example, the memory device 100 may include an unbuffered dual in-line memory module (UDIMM), a registered DIMM (RDIMM), a load reduced DIMM (LRDIMM), Non Volatile DIMM (NVDIMM), etc. Above examples are only examples for explaining inventive concepts, and inventive concepts are not limited thereto.

Below, for convenience of description, a single DRAM device will be described as an example of the memory device 100 of FIG. 1. However, inventive concepts may be applied to various storage devices including a volatile memory.

The memory device 100 may communicate with the host 10 and memory controller 50. For example, the memory device 100 may communicate with the host 10 and memory controller 50 based on one or more of various wired communication protocols, such as a universal serial bus (BUS), a small computer system interface (SCSI), PCIe, a mobile PCIe (M-PCIe), advanced technology attachment (ATA), parallel ATA (PATA), serial ATA (SATA), serial attached SCSI (SAS), integrated drive electronics (IDE), Firewire, universal flash storage (UFS), a transmission control protocol/Internet protocol (TCP/IP), and various wireless communication protocols, such as long term evolution (LTE), WiMax, global system for mobile communication (GSM), code division multiple access (CDMA), high speed packet access (HSPA), Bluetooth, near field communication (NFC), Wi-Fi, and radio frequency identification (RFID). However, inventive concepts are not limited thereto.

The memory device 100 may perform a write operation, a read operation, or a refresh operation in response to a command CMD and an address ADDR from the memory controller 50. For example, the memory controller 50 may apply a read command or a write command to the memory device 100 in response to receiving a data read request or data write request from the host 10. As described above, the memory device 100 includes a volatile memory. The volatile memory has such a characteristic that data stored therein disappears after a specific time. To retain the stored data, the volatile memory performs a refresh operation periodically. The refresh operation is an operation of rewriting data stored in the volatile memory periodically. The write operation, the read operation, and the refresh operation of the memory device 100 are performed as follows.

In the write operation, in response to a write request from the host 10, the memory controller 50 provides an active command and a row address to the memory device 100 together with a clock. After a specific time, the memory controller 50 provides a write command and a column address to the memory device 100 together with the clock. Afterwards, the memory controller 50 receives data to be written from the host 10 and the memory controller 50 provides the memory device 100 with data to be written. The memory device 100 writes the received data in a memory area that is selected by the row address and the column address.

In the read operation, in response to a read request from the host 10, the memory controller 50 provides an active command and a row address to the memory device 100 together with the clock. After a specific time, the memory controller 50 provides a read command and a column address to the memory device 100 together with the clock. The memory device 100 provides read-requested data to the memory controller 50 after a specific time. The memory controller 50 may provide the read-requested data to the host 10.

In the refresh operation, the memory controller 50 may provide a refresh command to the memory device 100 together with the clock for each regular refresh execution period tREFI. Below, a refresh operation that is performed according to the refresh command of the memory controller 50 is referred to as a "regular refresh operation". Alternatively, the memory controller 50 may provide the refresh command to the memory device 100 after postponing or pulling in the regular refresh execution period tREFI. Below, it is assumed that "N" regular refresh operations are performed on "N" regular refresh execution periods (N×tREFI) by the postponing or pulling-in of the regular refresh execution period tREFI. Also, below, the "N" regular refresh execution periods (N×tREFI) is referred to as a "reference time". In this case, there is no need for periodically inputting a refresh command to the memory device 100 for each regular refresh execution period tREFI, and "N" regular refresh operations may be performed even at any time point when a refresh operation is possible with regard to the "N" regular refresh execution periods (N×tREFI). In the memory device 100, a maximum value of "N" may be defined by the JEDEC (Joint Electron Device Engineering Council) standard.

The memory device 100 performs the refresh operation on memory cells of a refresh address, which is generated in the memory device 100 based on the refresh command. The memory device 100 does not receive a write or read command during a refresh execution time tRFC when the refresh operation is performed according to a command. The reason is that if the read or write command is processed in the execution of the refresh operation, data of memory cells to be accessed through the write or read operation is collided with data of memory cells of a row address on which the refresh operation is performed. Also, in addition to the regular refresh operation, the memory device 100 may perform a refresh operation for a special purpose in response to the refresh command from the memory controller 50. A command for the corresponding refresh operation will be described with reference to FIG. 13.

The memory device 100 performs the refresh operation on all memory cells thereof during one refresh cycle. That is, one refresh cycle includes a plurality of regular refresh execution periods tREFI and a plurality of reference times. In general, a period of the refresh cycle is fixed. Since the refresh operation is performed on all memory cells of the memory device 100, the regular refresh execution period tREFI and the refresh execution time tRFC may vary according to a memory capacity of the memory device 100. The regular refresh execution period tREFI and the refresh execution time tRFC are defined by the JEDEC standard. If one refresh cycle ends, the memory device 100 performs the refresh operation on all memory cells thereof again during a new refresh cycle.

The memory device 100 according to some example embodiments of inventive concepts performs a regular refresh operation in response to a command of the memory controller 50 or performs a hidden refresh operation in which a refresh operation is performed without the command of the memory controller 50. Below, the hidden refresh operation is referred to as a refresh operation that is performed without receiving the command (e.g., refresh command) of the memory controller 50 while the memory device 100 processes the write or read command.

The memory device 100 according to some example embodiments of inventive concepts includes the refresh controller 160. The refresh controller 160 controls the hidden refresh operation such that an access address on the write or read command is not collided with a refresh address and may count the number of times (hereinafter simply referred to as an "execution frequency") that the hidden refresh operation is performed and the number of times that the regular refresh operation is performed. Below, a total count value of the execution frequency of each of the regular refresh operation and the hidden refresh operation is referred to as an "execution count". The refresh controller 160 may generate refresh information RFR_inf based on a performance indicator of the hidden refresh operation (e.g., count value of the hidden refresh operation, hidden refresh active signal RFR_H described in FIG. 6) or performance indicators of both the hidden and regular refresh operations (e.g., count values of the hidden and regular refresh operations, count values of the refresh active signal RFR_en described in FIG. 6), but inventive concepts are not limited thereto. For example, the refresh controller 160 may generate refresh information RFR_inf based on the execution count. Also, the refresh controller 160 may provide the refresh information RFR_inf to the memory controller 50 when an internal flag is generated or the refresh controller 160 receives a request from the memory controller 50. Accordingly, the memory controller 50 may efficiently control the refresh operation of the memory device 100 including a plurality of volatile memories.

Figure 2:
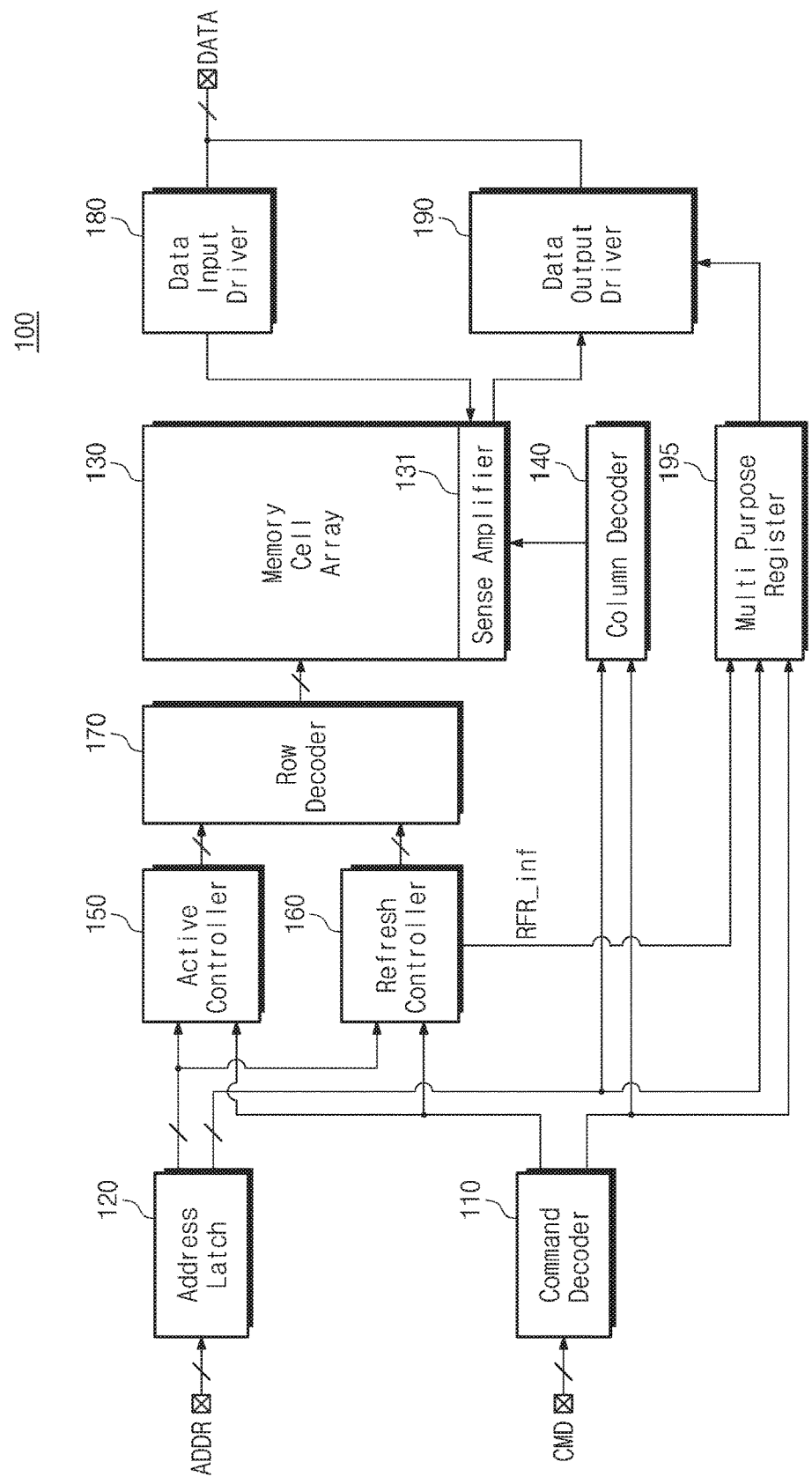
FIG. 2 is a block diagram illustrating a memory device of FIG. 1, according to some example embodiments of inventive concepts.

FIG. 2 is a block diagram illustrating a memory device of FIG. 1, according to some example embodiments of inventive concepts. Referring to FIG. 2, the memory device 100 includes a command decoder 110, an address latch 120, a memory cell array 130, a sense amplifier 131, a column decoder 140, an active controller 150, a refresh controller 160, a row decoder 170, a data input driver 180, a data output driver 190, and a multi-purpose register 195.

The command decoder 110 receives various commands through a command pad CMD. The command decoder 110 provides a command to circuit blocks including the column decoder 140, the active controller 150, the refresh controller 160, etc.

The address latch 120 receives an address of a memory cell to be accessed through an address pad ADDR. In the case where data is stored in a memory cell or is read from a memory cell, an address ADDR for selecting the memory cell may be provided to memory cell array 130 through the address latch 120, the column decoder 140, the active controller 150, the refresh controller 160, and the row decoder 170.

Data stored in the memory cell array 130 may be provided to the data output driver 190 through the sense amplifier 131. Alternatively, data received from the data input driver 180 may be stored in an area of the memory cell array 130 corresponding to a given address through the sense amplifier 131. An address ADDR on memory cells of the memory cell array 130, which are associated with data to be input/output, may be provided to the column decoder 140 and the row decoder 170.

The memory cell array 130 may include, for example, a plurality of banks. Each of the banks may include a plurality of mats. Each of the mats may include a plurality of memory cells. In some example embodiments, the active controller 150 and the refresh controller 160 may be provided for each bank to control each bank. This configuration will be described with reference to FIG. 5.

The active controller 150 generates an active address and an active signal for a write or read operation based on the address ADDR and the command CMD that are respectively provided from the address latch 120 and the command decoder 110 and provides the active address and the active signal to the row decoder 170.

The refresh controller 160 may be connected to memory cells in the memory cell array 100 through the row decoder 170 and word lines that connect the row decoder 170 to the memory cells. The refresh controller 160 may be configured to control a first refresh operation performed on a first portion of the memory cells while the memory device 100 performs a valid operation (e.g., write operation or read operation) on a second portion of the memory cells in the memory device 100. The first refresh operation may be the hidden refresh operation. The second refresh operation may be performed in response to receiving a refresh command from the memory controller 50, and the second refresh operation may be the regular refresh operation. Also, as described in FIG. 13, the memory device 100 may perform a refresh operation for a special purpose in response to the refresh command from the memory controller 50.

As in the active controller 150, the refresh controller 160 according to some example embodiments of inventive concepts generates an active address and an active signal and compares the active address with a hidden refresh address. The refresh controller 160 generates a hidden refresh active signal based on the comparison value and provides the hidden refresh active signal to the row decoder 170. The refresh controller 160 may generate a hidden refresh address based on the active signal. The refresh controller 160 generates a row address on which a regular refresh or a hidden refresh will be performed and provides the row address to the row decoder 170. Also, the refresh controller 160 generates the execution count by counting a regular refresh execution frequency and a hidden refresh execution frequency and generates the refresh information RFR_inf based on the execution count. The refresh controller 160 may provide the refresh information RFF_inf to the multi-purpose register 195. For example, the refresh information RFR_inf may include the execution count, the hidden refresh execution count, or a refresh end flag. The execution count, the hidden refresh execution count, and the refresh end flag will be described with reference to FIGS. 7, 8, and 10.

The row decoder 170 controls an operation of the memory cell array 130 together with the active controller 150 and the refresh controller 160 based on the active address, the active signal, the refresh active signal, the refresh address, etc. The data input driver 180 may receive data through a data pad DATA and may provide the received data to the sense amplifier 131. The data output driver 190 may output data read from the memory cell array 130 through the data pad DATA. Although not illustrated in FIG. 2, the data input driver 180 may receive a data strobe signal through a data strobe pad (e.g., DQS) upon receiving of data. Also, the data output driver 190 may output the data strobe signal through the data strobe pad upon outputting of data.

The multi-purpose register 195 may store information about an operation performed in the memory device 100. The multi-purpose register 195 may store, for example, the refresh information RFR_inf provided from the refresh controller 160. Also, in a multi-purpose register (MPR) read mode defined in the JEDEC standard, the refresh information RFR_inf stored in the multi-purpose register 195 may be provided to the memory controller 50 through the data output driver 190.

A reset signal may be provided by a reset command that is received from the memory controller 50 through the command pad CMD and the command decoder 110. The refresh information RFR_inf and a value stored in the multi-purpose register 195 may be randomly reset according to a request of the memory controller 50. Alternatively, the above-described reset command may be periodically received from the memory controller 50. That is, the refresh information RFR_inf and a value stored in the multi-purpose register 195 may be periodically reset according to the reset command received from the memory controller 50 every reference time.

In the case where the memory device 100 is a DRAM device, the memory device 100 operates in synchronization with a clock. To this end, components including a clock buffer, a delay locked loop circuit, a duty correction circuit, etc. may be further included in the memory device 100. Such components are less associated with example embodiments of inventive concepts, and a description thereof is thus omitted.

Figure 3:
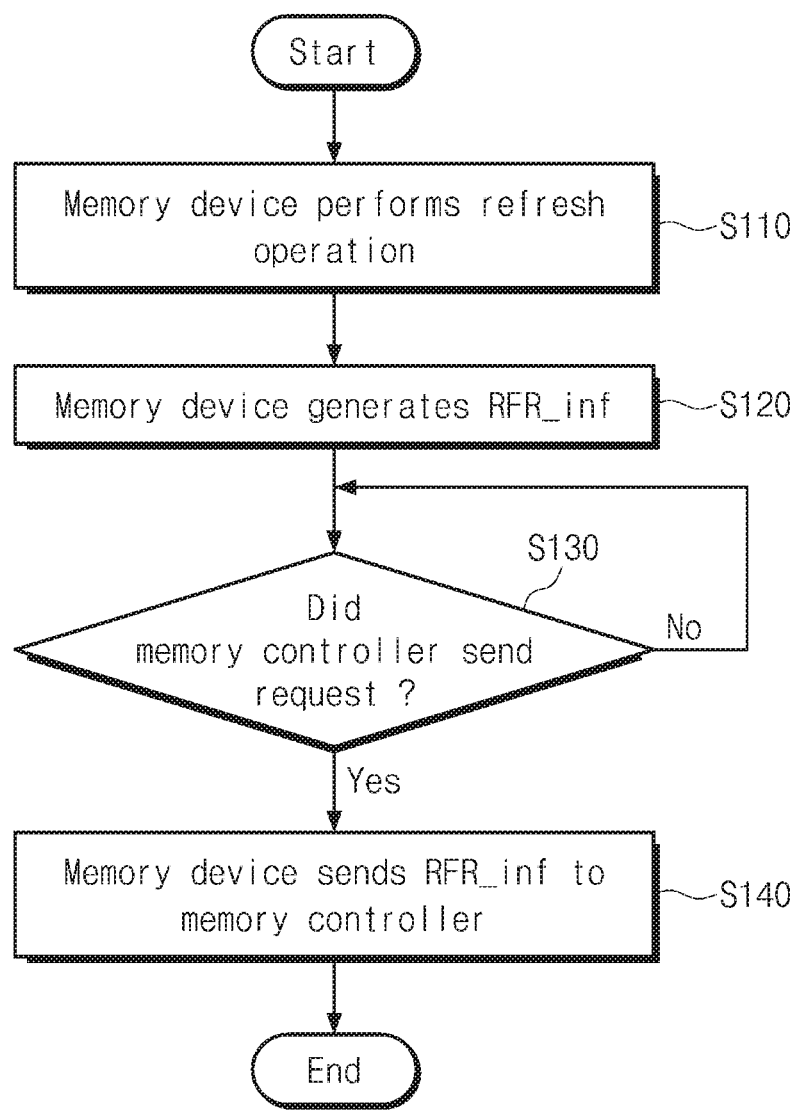
FIG. 3 is a flowchart illustrating an operation of a memory device of FIG. 2 according to some example embodiments of inventive concepts.

FIG. 3 is a flowchart illustrating an operation of a memory device of FIG. 2 according to some example embodiments of inventive concepts. FIG. 3 will be described with reference to FIGS. 1 and 2. Referring to FIG. 3, the memory device 100 may generate the refresh information RFR_inf and may provide the generated refresh information RFR_inf to the memory controller 50.

In operation S110, the memory device 100 performs a refresh operation. As described above, the memory device 100 may perform the regular refresh operation in response to the refresh command of the memory controller 50. Also, the memory device 100 may perform the hidden refresh operation in addition to the regular refresh operation.

In operation S120, the memory device 100 generates the execution count by counting a regular refresh execution frequency and a hidden refresh execution frequency and generates the refresh information RFR_inf based on the execution count. The refresh information RFF_inf may be stored in the multi-purpose register 195. As described above, the refresh information RFR_inf may include the execution count, the hidden refresh execution count, or the refresh end flag.

In operation S130, the memory device 100 determines whether the memory controller 50 requests the refresh information RFR_inf. If the refresh information RFR_inf is not requested by the memory controller 50 (No), the memory device 100 performs operation S130 again. In this case, however, the memory device 100 may additionally perform a hidden refresh operation or a regular refresh operation and may update the refresh information RFR_inf. The updated refresh information RFF_inf is again stored in the multi-purpose register 195. If the refresh information RFR_inf is requested by the memory controller 50 (Yes), the memory device 100 performs operation S140 and sends the refresh information RFR_inf to the memory controller 50.

In operation S140, the memory device 100 provides the refresh information RFR_inf to the memory controller 50. The memory device 100 provides the refresh information RFR_inf stored in the multi-purpose register 195 to the memory controller 50, based on the request of the memory controller 50 and an address of a register which stores the refresh information RFR_inf included in the multi-purpose register 195. However, the memory device 100 may be configured to omit operation S130 or to perform operation S140 based on a characteristic of the refresh information RFR_inf. For example, the refresh end flag included in the refresh information RFR_inf may be provided to the memory controller 50 without a request after being generated. This is to limit and/or prevent an additional refresh operation from being performed within the remaining part of the reference time by providing the refresh end flag to the memory controller 50 even in the case where the request of the memory controller 50 does not exist. Accordingly, it may be possible to limit and/or prevent power consumption of the memory device 100 and to limit and/or prevent a command from being generated unnecessarily. This is only an example, and the memory device 100 may be configured such that the refresh end flag is provided to the memory controller 50 only in response to a request of the memory controller 50.

As described above, the memory device 100 may reset the refresh information RFR_inf and the multi-purpose register 195. The reason is that the refresh information RFR_inf stored in the multi-purpose register 195 is valid only within a corresponding reference time.

Figure 4:
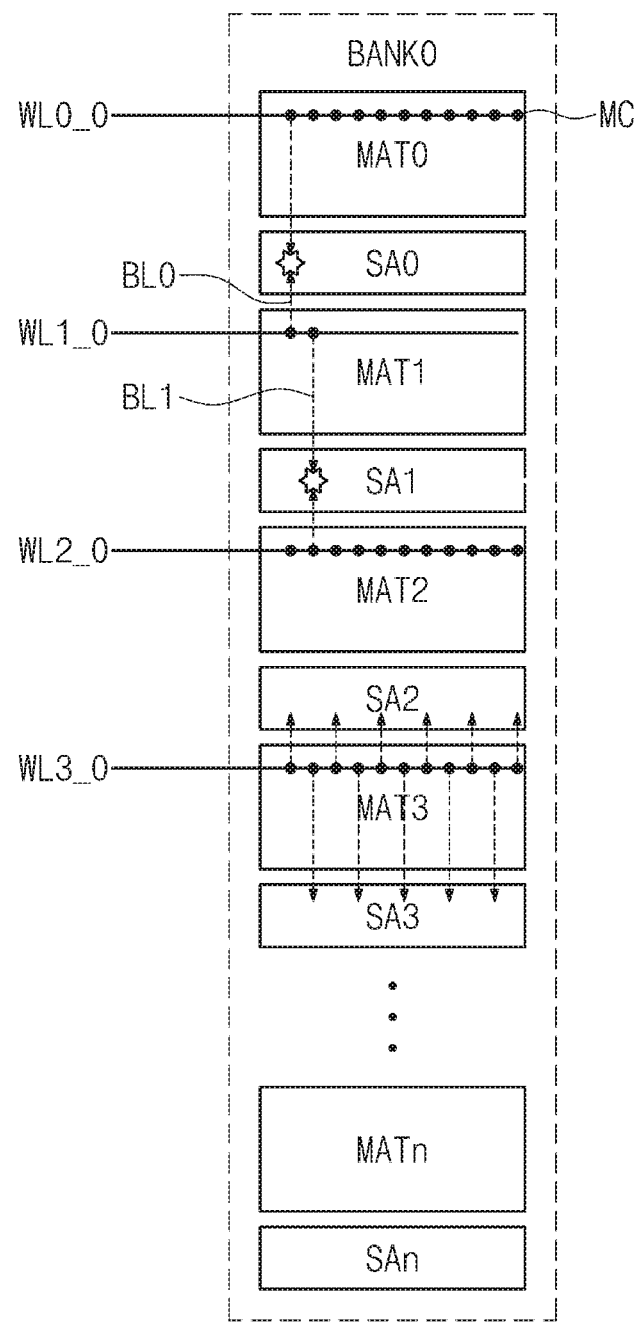
FIG. 4 is a drawing for describing a hidden refresh operation.

FIG. 4 is a drawing for describing a hidden refresh operation. FIG. 4 will be described with reference to FIG. 1. As described above, the memory cell array 130 may include a plurality of banks. A first bank Bank0 is illustrated in FIG. 4 as an example. The first bank Bank0 may include first to (n+1)-th mats MAT0 to MATn and first to (n+1)-th sense amplifier arrays SA0 to SAn. The first to (n+1)-th sense amplifier arrays SA0 to SAn may constitute the sense amplifier 131. The hidden refresh operation of the first bank Bank0 may be applied to the remaining banks.

Each of the first to (n+1)-th mats MAT0 to MATn may include a plurality of word lines. In each mat, a word line is selected by a row address. Each of the word lines is connected with a plurality of memory cells MC (e.g., DRAM memory cells). Also, data stored in memory cells connected to one word line is sensed by an adjacent sense amplifier.

A general data sensing operation is as follows. For example, data of a memory cell, which is connected to a first bit line BL0, from among memory cells connected to a first word line WL1_0 of the second mat MAT1 is sensed by a first sense amplifier (not illustrated) of the first sense amplifier array SA0. However, to compare a voltage of data read from a selected memory cell with a reference voltage, the first sense amplifier of the first sense amplifier array SA0 receives a pre-charged voltage of the first bit line BL0 of the first mat MAT0. Also, data of a memory cell, which is connected to a second bit line BL1, from among the memory cells connected to the first word line WL1_0 of the second mat MAT1 is sensed by a first sense amplifier (not illustrated) of the second sense amplifier array SA1. A sense amplifier for sensing data is selected according to a structure of a memory cell array.

Below, the hidden refresh operation will be described. It is assumed that the memory device 100 performs a read operation on a memory cell (hereinafter referred to as a "first memory cell of the second mat MAT1") connected to the first bit line BL0 and the first word line WL1_0 of the second mat MAT1. In general, to improve a read or write speed, the memory device 100 that is driven in a double data rate (DDR) manner reads or writes pieces of data at the same time by prefetching data. That is, in the case where the memory device 100 is a memory device operating in a DDR3 manner, the memory device 100 performs a prefetch operation on eight bits ($2^3$). For example, the memory device 100 performs a read operation on memory cells (hereinafter referred to as "second to eighth memory cells of the second mat MAT1") connected to second to eighth bit lines BL2 to BL7 and the first word line WL1_0 of the second mat MAT1. In this case, pieces of data are sensed by the first and second sense amplifier arrays SA0 and SA1 adjacent to the second mat MAT1.

It is assumed that the memory device 100 performs a refresh operation on a first word line WL_0 or WL2_0 of the first or third mats MAT0 or MAT2 together with the above-described read operation. In general, the refresh operation is performed on all memory cells connected to a selected word line. That is, the refresh operation is performed on all memory cells (hereinafter referred to as "first to (n+1)-th memory cells of the first mat MAT0") connected to the first word line WL0_0 of the first mat MAT0 or all memory cells (hereinafter referred to as "first to (n+1)-th memory cells of the third mat MAT2") connected to the first word line WL2_0 of the third mat MAT2.

To perform the refresh operation, data of the first memory cell of the first mat MAT0 is sensed by a first sense amplifier (not illustrated) of the first sense amplifier array SA0. Also, to perform the read operation, data of the first memory cell of the second mat MAT1 is sensed by the first sense amplifier (not illustrated) of the first sense amplifier array SA0. As described above, a sense amplifier may receive data of a memory cell and a reference voltage to perform a sensing operation. In this case, since the corresponding sense amplifier receives two pieces of data, the corresponding sense amplifier fails to compare data with the reference voltage.

This issue also occurs at a second sense amplifier (not illustrated) of the second sense amplifier array SA1. That is, the second sense amplifier of the second sense amplifier array SA1 receives data of the second memory cell of the second mat MAT1 and data of the second memory cell of the third mat MAT2 as an input. Accordingly, the corresponding sense amplifier fails to compare data with the reference voltage. This issue also occurs at third to eighth memory cells of the second mat MAT1.

Accordingly, the hidden refresh operation is performed on a mat that is not adjacent to a mat to be accessed according to the write operation or the read operation. For example, the hidden refresh operation may be performed on a first portion of memory cells MC while the valid operation (e.g., write or read operation) is performed on a second portion of the memory cells MC. The first and second portions of the memory cells MC, respectively, may be in mats that are not adjacent to each other. For example, in the above-described example, the hidden refresh operation may be performed on the fourth to (n+1)-th mats MAT3 to MATn. In this case, a data line that is used to input or output data accessed according to the write or read operation may be controlled such that a mat, on which the hidden refresh operation is performed, is not connected to the data line. An operation and a configuration of a refresh controller that generates an address for a hidden refresh operation will be described with reference to FIG. 6.

Figure 5:
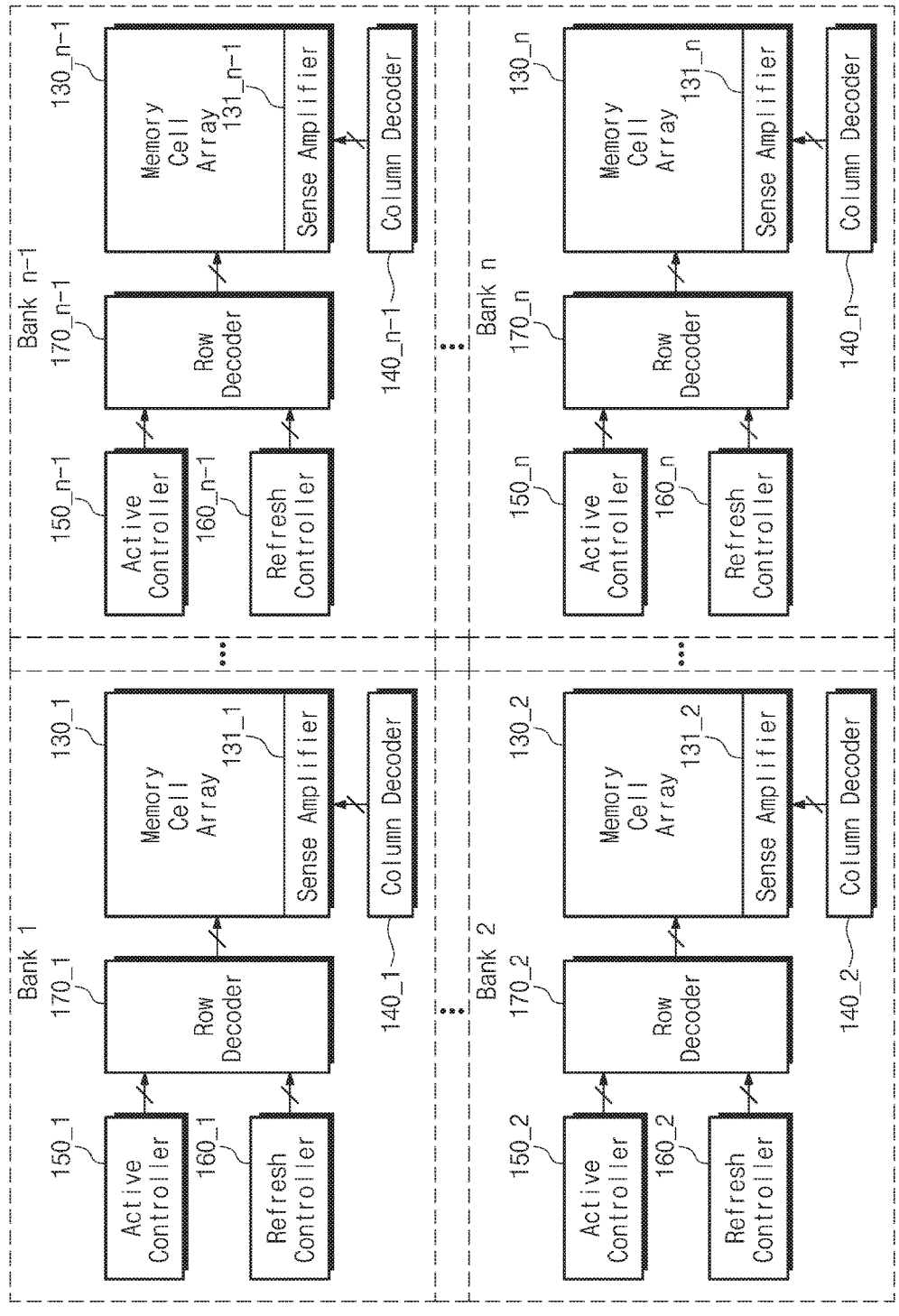
FIG. 5 is a block diagram illustrating a memory cell array of FIG. 2 including a plurality of banks, according to some example embodiments of inventive concepts.

FIG. 5 is a block diagram illustrating a memory cell array of FIG. 2 including a plurality of banks, according to some example embodiments of inventive concepts. Referring to FIG. 5, the column decoder 140, the active controller 150, the refresh controller 160, and the row decoder 170 of FIG. 1 may be provided for each bank to operate independently on the memory cell array 130 and the sense amplifier 131, each of which is divided to correspond to "n" banks, respectively.

That is, the memory cell array 130 may include first to n-th memory cell arrays 130_1 to 130_n, the sense amplifier 131 may include first to n-th sense amplifiers 131_1 to 131_n, and the column decoder 140 may include first to n-th column decoders 140_1 to 140_n. The active controller 150 may include first to n-th active controllers 150_1 to 150_n, the refresh controller 160 may include first to n-th refresh controllers 160_1 to 160_n, and the row decoder 170 may include first to n-th row decoders 170_1 to 170_n.

Each of the first to n-th refresh controllers 160_1 to 160_n may perform the hidden refresh operation on each of the first to n-th banks Bank1 to Bankn. Here, as described with reference to FIG. 4, in the case where an active address is collided with a refresh address in one bank, the first to n-th refresh controllers 160_1 to 160_n may be configured such that the hidden refresh operation is not performed on all the first to n-th banks Bank1 to Bankn. Alternatively, in the case where an active address is collided with a refresh address in a bank, the first to n-th refresh controllers 160_1 to 160_n may be configured to perform the hidden refresh operation on the remaining banks, in which address collision does not occur, other than the corresponding bank. The remaining operations on the above components of each of the first to n-th banks Bank1 to Bankn other than those described with reference to FIG. 5 are the same as those described with reference to FIGS. 1 to 5, and a description thereof is thus omitted.

Figure 6:
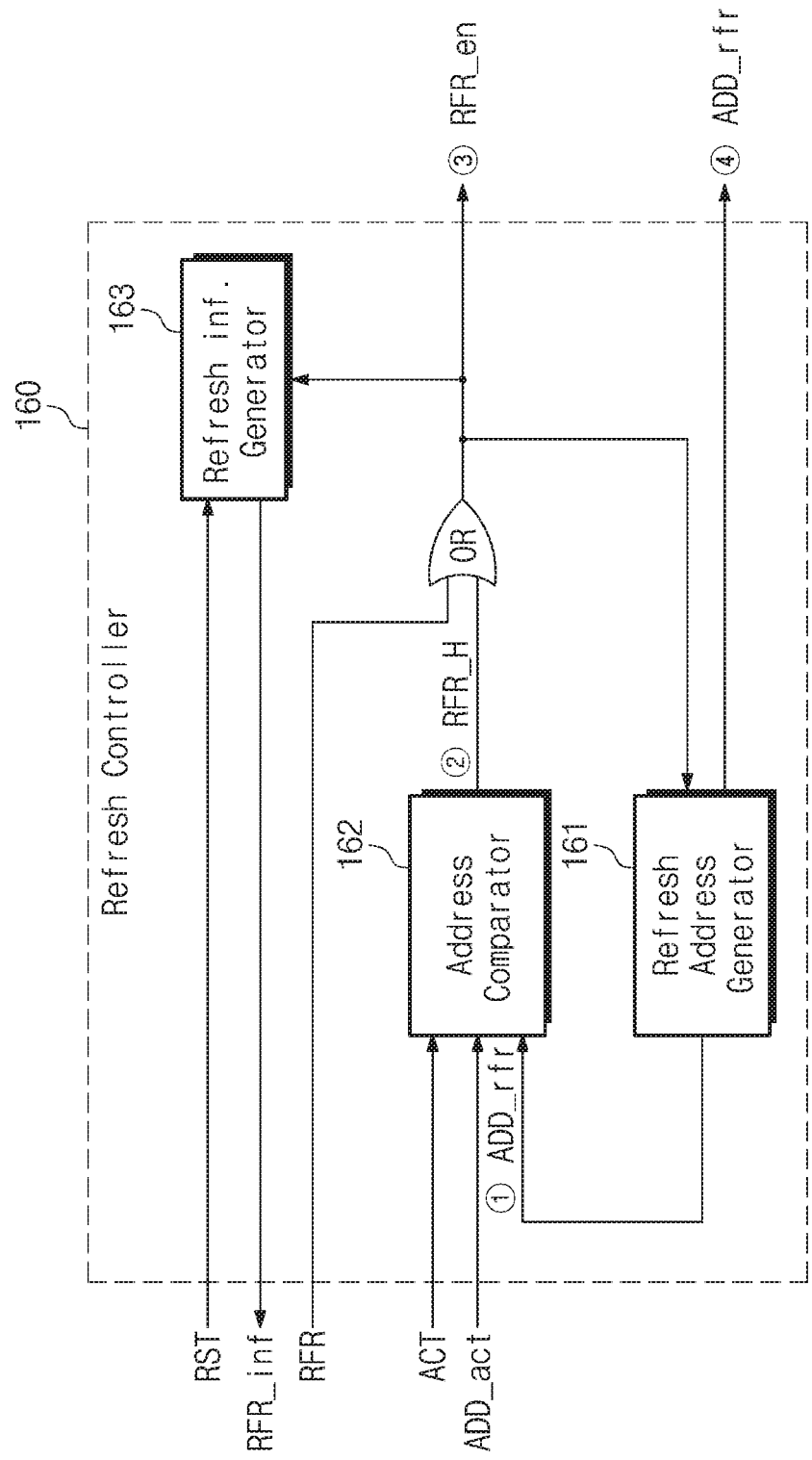
FIG. 6 is a block diagram illustrating a refresh controller illustrated in FIG. 3, according to some example embodiments of inventive concepts.

FIG. 6 is a block diagram illustrating a refresh controller illustrated in FIG. 3, according to some example embodiments of inventive concepts. Referring to FIG. 6, the refresh controller 160 may include a refresh address generator 161, an address comparator 162, a logic gate (e.g., OR gate), and a refresh information generator 163. As described with reference to FIG. 4, the refresh controller 160 determines whether an active address and a refresh address are collided with each other and generates a signal for performing the hidden refresh operation based on the determination result. Also, the refresh controller 160 counts a regular refresh execution frequency and a hidden refresh execution frequency and generates refresh information based on the count result. An example is described hereinafter where the logic gate is an OR gate, but inventive concepts are not limited thereto.

The refresh address generator 161 generates a row address on which the refresh operation will be performed. In general, the refresh operation is sequentially performed on row addresses. In this case, the refresh address generator 161 may include, for example, a counter. The refresh address generator 161 generates a refresh address ADD_rfr (also referred to as a hidden refresh address) and provides the refresh address ADD_rfr to the address comparator 162 (①).

The address comparator 162 is provided with an active signal ACT and an active address ADD_act according to a write command or a read command. The address comparator 162 determines whether the active address ADD_act is collided with the refresh address ADD_rfr and generates a hidden refresh active signal RFR_H based on the determination result of the refresh address ADD_rfr and active address ADD_act (②).

The logic OR generates a refresh active signal RFR_en by performing an OR operation on the hidden refresh active signal RFR_H and a regular refresh active signal RFR (③).

The refresh active signal RFR_en is fed back to the address comparator 162 such that the refresh address ADD_rfr generated in operation ① is provided to the row decoder 170 (④). Also, the refresh active signal RFR_en is fed back to the address comparator 162 such that the refresh address ADD_rfr is updated by the address comparator 162. Afterwards, the row decoder 170 of FIG. 2 decodes the refresh address ADD_rfr and performs the refresh operation on memory cells of the memory cell array 130 corresponding to the decoded refresh address in response to the refresh active signal RFR_en.

The refresh information generator 163 generates the refresh information RFR_inf in response to the refresh active signal RFR_en. The refresh information generator 163 may generate the refresh information RFR_inf using the hidden refresh signal RFR_H because the OR gate may generate the refresh active signal RFR_en based on a comparison result between the regular refresh signal RFR and the hidden refresh signal RFR_H. The refresh information generator 163 may be also reset by a reset signal RST that is provided from the memory controller 50 randomly or periodically every reference time. An example configuration of the refresh information generator 163 will be described with reference to FIGS. 7, 8, and 10.

Figure 7:
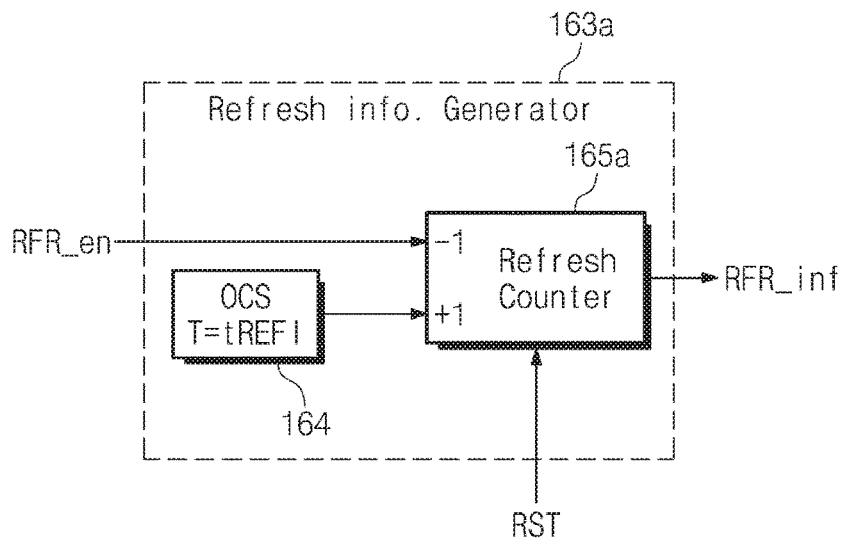
FIGS. 7 and 8 are block diagrams illustrating a refresh information generator illustrated in FIG. 6, according to some example embodiments of inventive concepts.
Figure 8:
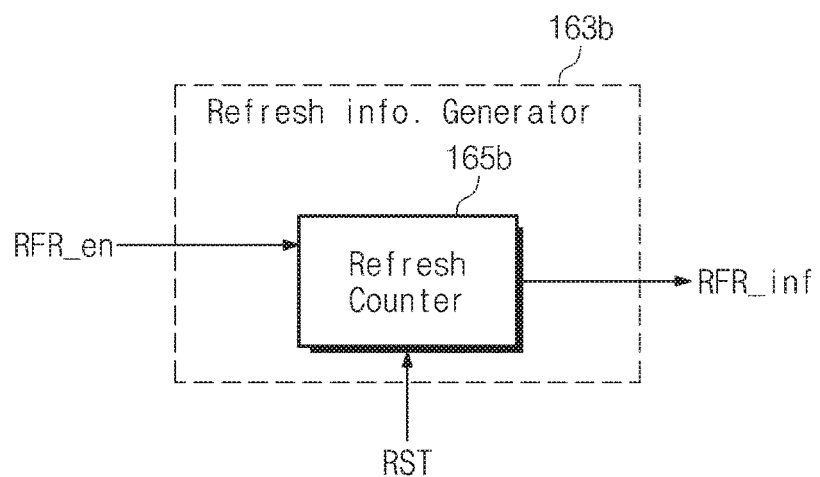

FIGS. 7 and 8 are block diagrams illustrating a refresh information generator illustrated in FIG. 6, according to some example embodiments of inventive concepts. FIGS. 7 and 8 will be described with reference to FIG. 6.

Referring to FIG. 7, a refresh information generator 163a may include an oscillator 164 and a refresh counter 165a.

The refresh information generator 163a of FIG. 7 may generate the execution count or the hidden refresh execution count.

The oscillator 164 provides a count-up signal to the refresh counter 165a for each regular refresh execution period tREFI. For example, the regular refresh execution period tREFI may be provided from the memory controller 50.

The refresh counter 165a is provided with the count-up signal and the refresh active signal RFR_en. The refresh counter 165a increases a count value in response to the count-up signal and decreases the count value in response to the refresh active signal RFR_en. The refresh counter 165a outputs the generated count value as the refresh information RFR_inf. A change of the refresh information RFR_inf over time will be described with reference to FIG. 9. A count value means the number of times that the hidden refresh operation is performed and is referred to as a "hidden refresh execution count". The memory controller 50 may calculate the number of refresh operations to be performed within the remaining part of the reference time, based on the refresh information RFR_inf.

Also, the refresh counter 165a may generate the execution count by counting the refresh active signal RFR_en. That is, the refresh information RFR_inf may include the hidden refresh execution count and the execution count.

Referring to FIG. 8, a refresh information generator 163b may include a refresh counter 165b. As described with reference to FIG. 7, the refresh counter 165b of FIG. 8 may generate the execution count by counting the refresh active signal RFR_en. In this case, the refresh information RFR_inf may include the execution count.

The refresh information RFR_inf generated by the refresh information generator 163a or 163b of FIG. 7 or 8 may be stored in the multi-purpose register 195. The refresh information RFR_inf stored in the multi-purpose register 195 may be provided to the memory controller 50 by a request of the memory controller 50. The refresh counters 165a and 165b of FIGS. 7 and 8 may be reset by the reset signal RST.

Figure 9:
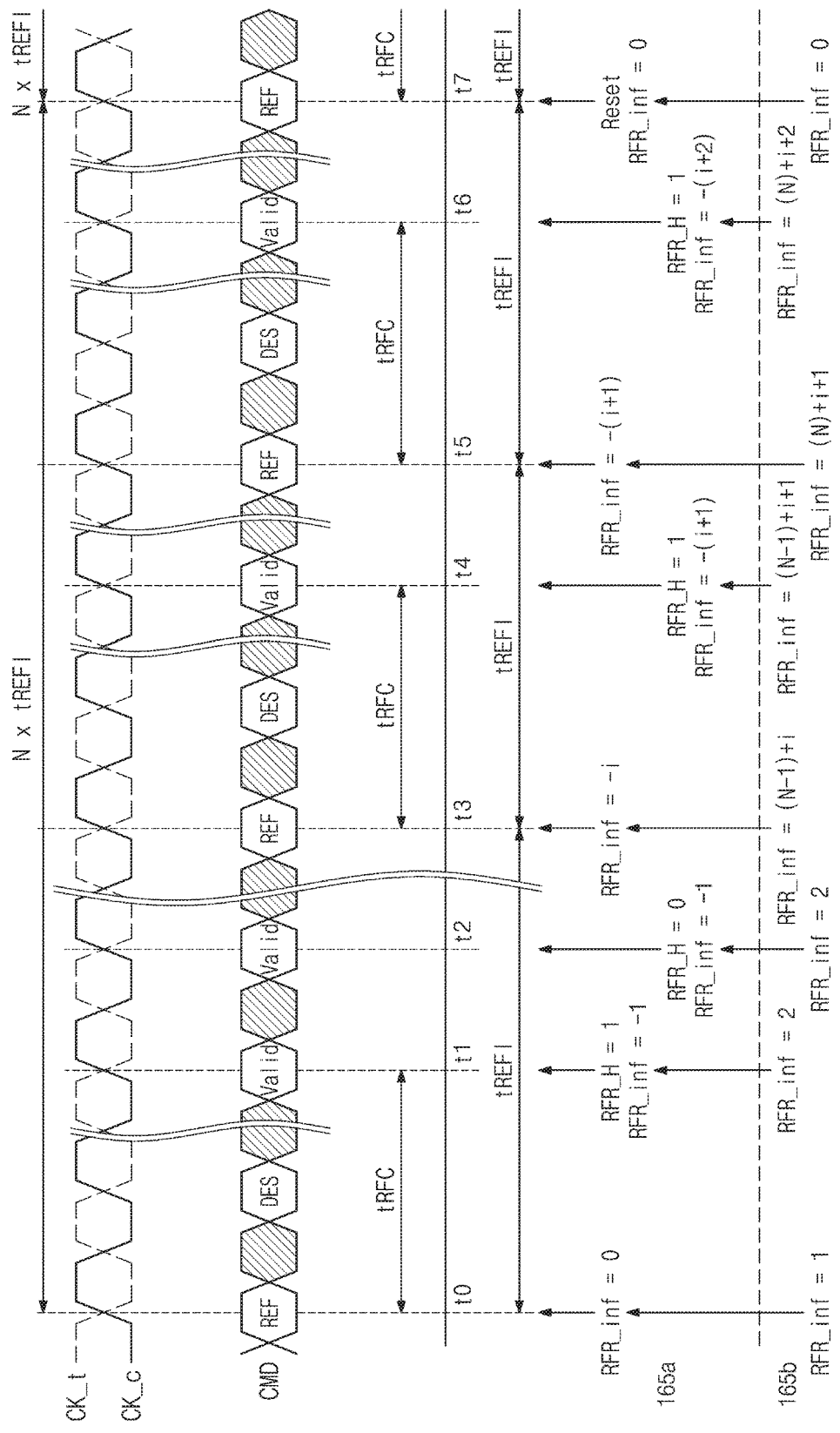
FIG. 9 is a timing diagram for describing operations of refresh information generators of FIGS. 7 and 8.

FIG. 9 is a timing diagram for describing operations of refresh information generators of FIGS. 7 and 8. FIG. 9 will be described with reference to FIGS. 2, 7, and 8. A memory device 100 of FIG. 1 may include at least one of the refresh information generator 163a and 163b of FIGS. 7 and 8. Referring to FIG. 9, the refresh information generator 163a or 163b of FIG. 7 or 8, may update the refresh information RFR_inf based on a performance indicator of the hidden refresh operation and/or performance indicators of both the hidden refresh operation and the regular refresh operation. In this manner, the refresh information generator 163a or 163b may update the refresh information RFR_inf whenever the hidden refresh operation or the regular refresh operation is completely performed. The refresh information RFF_inf may be stored in the multi-purpose register 195 whenever the refresh information RFR_inf is updated. Below, a description thereof is omitted. As described with reference to FIG. 1, below, the "N" regular refresh execution periods (N×tREFI) are defined as a "reference time". The reference time is defined by a time period between t0 and t7. A new reference time starts after the time point t7.

In an example of FIG. 9, the memory device 100 receives the refresh command REF from the memory controller 50 for each regular refresh execution period tREFI. Each of a plurality of regular refresh execution periods tREFI includes the refresh execution period tRFC. The refresh execution time tRFC is a minimum time needed for the memory device 100 to perform the regular refresh operation. During the refresh execution time tRFC, the memory device 100 does not receive a command associated with an active operation such as a read operation or a write operation. Accordingly, during the refresh execution time tRFC, the memory device 100 is provided with a deselect signal DES such that only the refresh operation is performed. The refresh information generator 163a or 163b of FIG. 7 or 8 operates as follows.

At t0, the memory device 100 receives the refresh command REF. Afterwards, the memory device 100 performs the regular refresh operation. With regard to the refresh information generator 163a of FIG. 7, the refresh counter 165a generates a down count in response to the refresh active signal RFR_en. Also, the refresh counter 165 receives an up count from the oscillator 164 as the regular refresh execution period tREFI starts. Hence, the refresh counter 165a outputs a count of "0" as the refresh information RFR_inf. In this case, since the regular refresh operation is being performed, the hidden refresh operation is not performed.

With regard to the refresh information generator 163b of FIG. 8, the refresh counter 165b receives the refresh active signal REF_en to output a count of "1" as the refresh information RFR_inf.

At t1, the memory device 100 receives a valid command Valid such as a write command or a read command. Although not illustrated in FIG. 9, the memory device 100 receives address information associated with the valid command. The memory device 100 performs an active operation corresponding to the valid command on the received address. It is assumed that the received address and a refresh address are not collided with each other. With this assumption, the hidden refresh active signal RFR_H is generated. In this case, the refresh counter 165 of the refresh information generator 163a of FIG. 7 generates a down count in response to the refresh active signal RFR_en. That is, the refresh counter 165a outputs a count of "−1" as the refresh information RFR_inf.

With regard to the refresh information generator 163b of FIG. 8, the refresh counter 165b receives the refresh active signal REF_en to output a count of "2" as the refresh information RFR_inf.

Thus, during the reference time from t0 to t1, the refresh information generator 163a of FIG. 7 of the refresh controller 160 may generate the refresh information based on a performance indicator of the hidden refresh operation, such as receiving the refresh active signal RFR_en at t1 after the regular refresh execution period tREF1 started at t0. In other example embodiments, the refresh information generator 163 may generate the refresh information based on a different performance indicator that indicates the hidden refresh operation has been performed, such as a value of hidden refresh active signal RFR_H (e.g., if RFR_H equals to 1).

Similarly, during the reference time from t0 to t1, the refresh information generator 163b of FIG. 8 of the refresh controller 160 may generate the refresh information based on performance indicators of the hidden refresh operation and the regular refresh operation. For example, refresh information generator 163b may generate the refresh information based on using the refresh active signal RFR_en to determine the hidden refresh operation or the regular refresh operation has been performed. However, one of ordinary skill in the art would appreciate that the refresh generator 163 of FIG. 6 may use different performance indicators of the hidden and regular refresh operations to generate the refresh information RFR_inf. For example, the refresh generator 163 of FIG. 6 may alternatively generate the refresh information RFR_inf based on detecting the refresh command REF or deselect signal DES as a performance indicator of the regular refresh operation, and detecting a value of the hidden refresh active signal RFR_H (e.g., if RFR_H=1) that indicates the hidden refresh operation has been performed.

At t2, the memory device 100 receives a valid command Valid including a write command or a read command, as in that described at t1. However, in this case, since the received address and the refresh address are collided with each other, the hidden refresh active signal RFR_H may not be generated (e.g., RFR_H equals '0'). Hence, the refresh counter 165a of the refresh information generator 163a of FIG. 7 maintains a previous count of "−1" without updating of the count. The refresh information generator 163a repeats operations of a plurality of regular refresh execution periods tREFI until t3. The refresh counter 165b of the refresh information generator 163b of FIG. 8 maintains a previous count of "2" without updating of the count. In other words, because the regular refresh information or hidden refresh information are not performed at t2, a performance indicator that indicates the performance is the regular refresh information or hidden refresh information is not provided.

At t3, on the basis of a previous regular refresh operation or hidden refresh operation, the refresh counter 165a of the refresh information generator 163a illustrated in FIG. 7 outputs a count of "−i" as the refresh information RFR_inf. The refresh counter 165b of the refresh information generator 163b of FIG. 8 counts (N−1) regular refresh operations and "i" hidden refresh operations performed before t3 to output a count of "(N−1)+i" as the refresh information RFR_inf.

At t4, the memory device 100 performs the hidden refresh operation. In this case, the refresh counter 165 of the refresh information generator 163a illustrated in FIG. 7 outputs a count of "−(i+1)" as the refresh information RFR_inf. The refresh counter 165b of the refresh information generator 163b illustrated in FIG. 8 outputs a count of "(N−1)+i+1" as the refresh information RFR_inf.

At t5, the refresh counter 165a or 165b of FIG. 7 or 8 performs the same operation as that performed at t3. That is, the refresh counter 165a of FIG. 7 outputs "−(i+1)", and the refresh counter 165b of FIG. 8 outputs "(N+i+1)". At t6, the refresh counter 165a or 165b of FIG. 7 or 8 performs the same operation as that performed at t4. As a result, the refresh counter 165a of FIG. 7 outputs "−(i+2)", and the refresh counter 165b of FIG. 8 outputs "(N)+i+2". The memory controller 50 may request the refresh information RFR_inf from the memory device 100, and the memory device 100 may provide the memory controller 50 with the refresh information RFR_inf of each time point in response to the request. The memory controller 50 may be provided with information about a refresh execution frequency including regular refresh execution frequency and hidden refresh execution frequency or a hidden refresh execution frequency of each time point and may control the refresh command of the memory device 100 based on the received information. A refresh command control method of the memory controller 50 will be described with reference to FIGS. 12 and 13.

At t7, the memory device 100 starts a refresh operation associated with a new reference time. For example, as described above, the memory device 100 may receive a reset command together with the refresh command REF every reference time. The refresh information RFR_inf and a value stored in the multi-purpose register 195 may be periodically reset to an initial or base value (e.g., RFR_inf=0) by a reset signal. The reset signal may be provided from the memory controller 50 and/or host 10 to the refresh controller 160 through the command decoder 110, for example, if a time interval corresponding to the reference time ends. The reset operation may be performed before the refresh information generator 163a or 163b of FIG. 7 or 8 generates the refresh information RFR_inf. The reason is that the refresh information generator 163a/163b newly generates the reset refresh information RFR_inf in response to a first refresh command REF associated with the new reference time. As described above, the reset signal may be provided by a command that is received through the command pad CMD and the command decoder 110. This is only an example. As described above, the reset signal may be provided by a command of the memory controller 50 before a time point t7 when the new reference time starts. During the new reference time, the refresh information generators 163a and 163b of FIGS. 7 and 8 may generate (or update) the refresh information RFR_inf the same way as described above.

Referring to FIGS. 1, 6-9, the refresh controller 160 of FIG. 6 may generate refresh information RFR_inf, to be submitted to the memory controller 50, based on a number of times the volatile memory device 100 performs the hidden refresh operation during the reference time. Also, the refresh controller 160 may be configured to update the refresh information RFR_inf if the volatile memory device 100 performs at least one of the regular refresh operation and the hidden refresh operation. For example, as discussed above, at times t1, t4, and t6, the refresh information generator 163a of FIG. 7 and the refresh information generator 163b of FIG. 8 may adjust the refresh information RFR_inf differently in response to the hidden refresh operation being performed. Also, at times t0, t3, and t5, the refresh information generator 163a of FIG. 7 may maintain a value of the refresh information RFR_inf and the refresh information generator 163b of FIG. 8 may adjust the refresh information RFR_inf in response to the regular refresh operation being performed.

Figure 10:
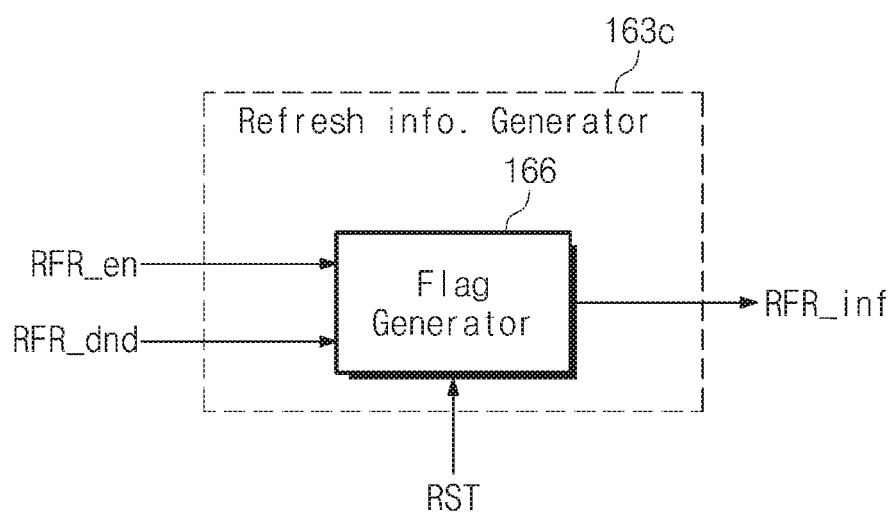
FIG. 10 is a block diagram illustrating a refresh information generator illustrated in FIG. 6, according to some example embodiments of inventive concepts.

FIG. 10 is a block diagram illustrating a refresh information generator illustrated in FIG. 6, according to some example embodiments of inventive concepts. FIG. 10 will be described with reference to FIG. 6. Referring to FIG. 10, a refresh information generator 163c may include a flag generator 166.

The flag generator 166 is provided with a refresh demand count RFR_dnd and the refresh active signal RFR_en. The refresh demand count RFR_dnd means the number of refresh operations that are performed on each of banks of the memory cell array 130 of FIG. 1 during one reference time. For example, the refresh demand count RFR_dnd may correspond to a value that is obtained by dividing a reference time by the regular refresh execution period tREFI. For example, the refresh demand count RFR_dnd may have a value of "N" with regard to a reference time that corresponds to the "N" regular refresh execution periods (N×tREFI).

For example, the refresh demand count RFR_dnd may be provided from the memory controller 50. Alternatively, the refresh information generator 163c may further include a counter (not illustrated) that generates the refresh demand count RFR_dnd. In this case, the counter (not illustrated) may generate the refresh demand count RFR_dnd based on to a reference time and the regular refresh execution period tREFI received from the memory controller 50.

The flag generator 166 generates the execution count by counting the refresh active signal RFR_en. The flag generator 166 may output the execution count as the refresh information RFR_inf. The flag generator 166 generates the refresh end flag if the execution count is greater than or equal to the refresh demand count RFR_dnd. The flag generator 166 may output the refresh end flag as the refresh information RFR_inf. That is, the refresh end flag means that "N" refresh operations are all performed within a reference time. The flag generator 166 may output the execution count including the refresh information RFR_inf. In this case, the refresh information RFR_inf may include the execution count and the refresh end flag.

As described with reference to FIG. 3, the refresh end flag may be generated in response to a request of the memory controller 50 or without a request of the memory controller 50 and may be provided to the memory controller 50 within a given time. For example, the refresh information generator 163 may be configured to include one of the refresh information generators 163a, 163b, and 163c of FIGS. 7, 8, and 10 or one or more combinations thereof.

Figure 11:
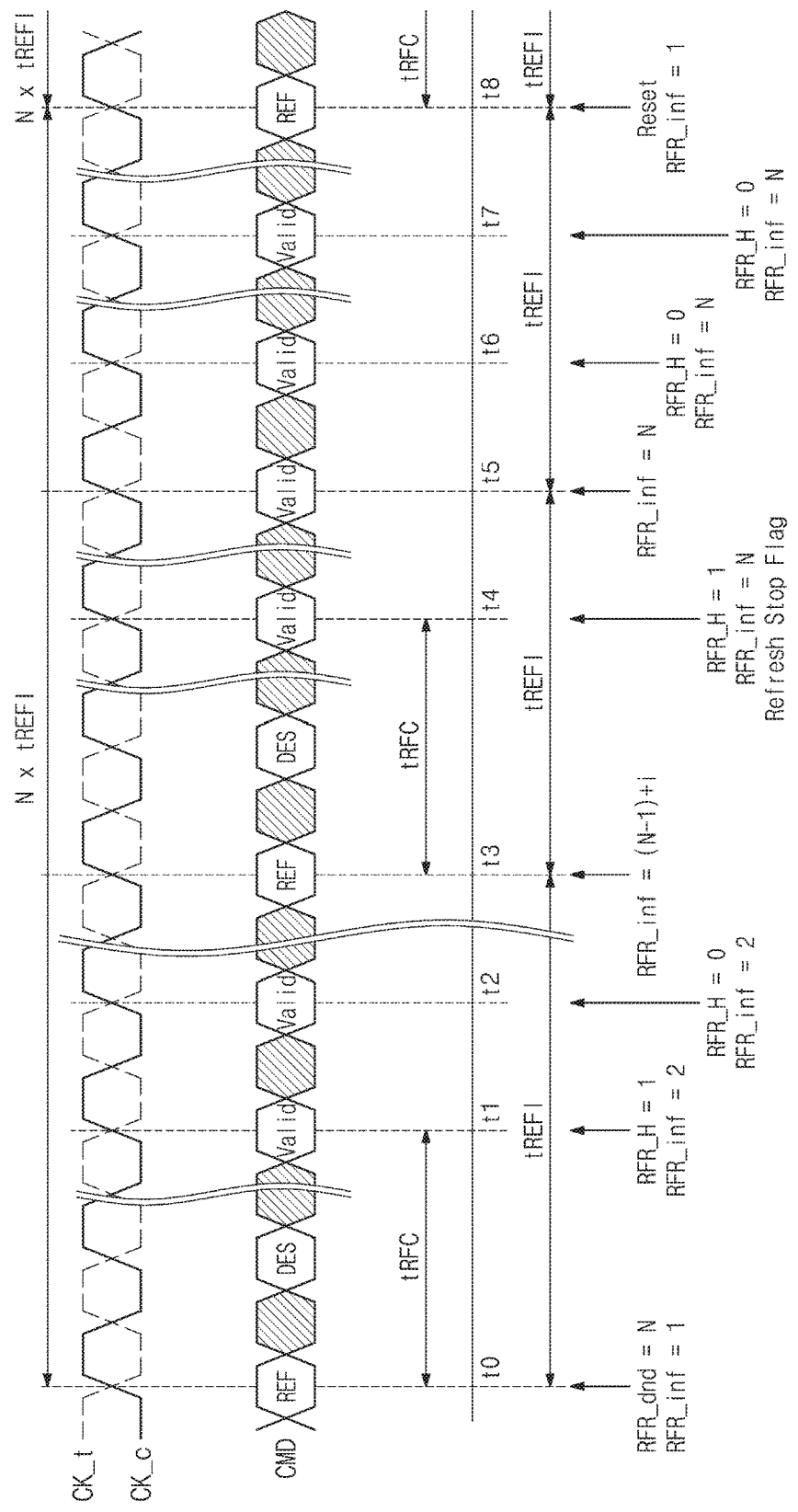
FIG. 11 is a timing diagram for describing an operation of a refresh information generator of FIG. 10.

FIG. 11 is a timing diagram for describing an operation of a refresh information generator of FIG. 10. FIG. 11 will be described with reference to FIGS. 2 and 10. Referring to FIG. 11, in the case where the number of times that a hidden refresh operation or a regular refresh operation is performed is greater than or equal to the refresh demand count RFR_inf, the refresh information generator 163c of FIG. 10 may output the refresh end flag as the refresh information RFR_inf. Definitions of a reference time corresponding to "N" regular refresh execution periods (N×tREFI), the refresh command REF, the valid command Valid, the regular refresh execution period tREFI, and the refresh execution time tRFC are the same as those described with reference to FIG. 9, and a description thereof is thus omitted.

In FIG. 11, it is assumed that the refresh demand count RFR_dnd is "N". The refresh information generator 163c may generate the execution count. In this case, the refresh information RFR_inf may include the execution count or the refresh end flag. The refresh information generator 163c updates the execution count when the hidden refresh operation or the regular refresh operation is performed. In some example embodiments, the refresh information RFF_inf may be stored in the multi-purpose register 195 whenever the execution count is updated. Alternatively, the refresh end flag may not be stored in the multi-purpose register 195, but it may be directly provided to the memory controller 50.

At t0, the memory device 100 performs the regular refresh operation in response to the refresh command REF, and the flag generator 166 is provided with the refresh active signal RFR_en according to the refresh operation. In this case, the flag generator 166 updates the execution count with "1". However, the refresh end flag may not be generated. The flag generator 166 outputs the execution count as the refresh information RFR_inf.

At t1, the memory device 100 performs the hidden refresh operation, and thus the flag generator 166 updates a value of the execution count with "2". At t2, since the memory device 100 does not perform the hidden refresh operation, the flag generator 166 maintains the value of the execution count, that is, "2". During a time period between t2 and t3, the memory device 100 may perform a plurality of regular refresh operations or a plurality of hidden refresh operations. At t3, on the basis of a previous regular refresh operation or hidden refresh operation, the refresh counter 165 outputs a count value of "(N−1)" as the refresh information RFR_inf.

At t4, the memory device 100 performs the hidden refresh operation, and thus the refresh information RFR_inf is "N". In this case, the flag generator 166 generates the refresh end flag. As described above, the refresh end flag may be generated in response to a request of the memory controller 50 or without a request of the memory controller 50 and may be provided to the memory controller 50 within a given time. In response to the refresh end flag, the memory controller 50 may stop providing the refresh command REF or may control the refresh operation of the memory device 100 such that the hidden refresh operation is not performed. This will be described with reference to FIG. 13.

The refresh controller 160 may limit and/or prevent the volatile memory device 100 from performing an additional hidden refresh operation or an additional regular refresh operation during a remaining portion of the reference time if the refresh controller 160 determines a sum of a count value of the hidden refresh operation and a count value of the regular refresh operation during the reference time is greater than or equal to a threshold value corresponding to the refresh demand RFR_dnd. At t5, a new regular refresh execution period tREFI starts. However, since the refresh command REF is not provided after the refresh end flag is provided to the memory controller 50, the memory device 100 may receive the valid command Valid. Operations performed at t6 and t7 are the same as those performed at t5. Accordingly, the memory device 100 may not perform the refresh operation, but it may perform an operation corresponding to the valid command Valid. Hence, the efficiency in which the memory device 100 processes data may increase.

During a first part of the reference time (e.g., from t0 to t3), the refresh controller 160 may generate the refresh information RFR_inf based on a performance indicator (e.g., count value) of the hidden refresh information. The refresh information RFR_inf may be generated based on a performance indicator of the regular refresh operation and hidden refresh operation, such as a sum of the number of regular and hidden refresh operations performed during the first part of the reference time.

As in that described at t7 of FIG. 8, at t8, the memory device 100 may be provided with a reset signal and the refresh command REF with regard to a new reference time. The following operations are the same as those described with reference to a time period between t1 to t7.

Figure 12:
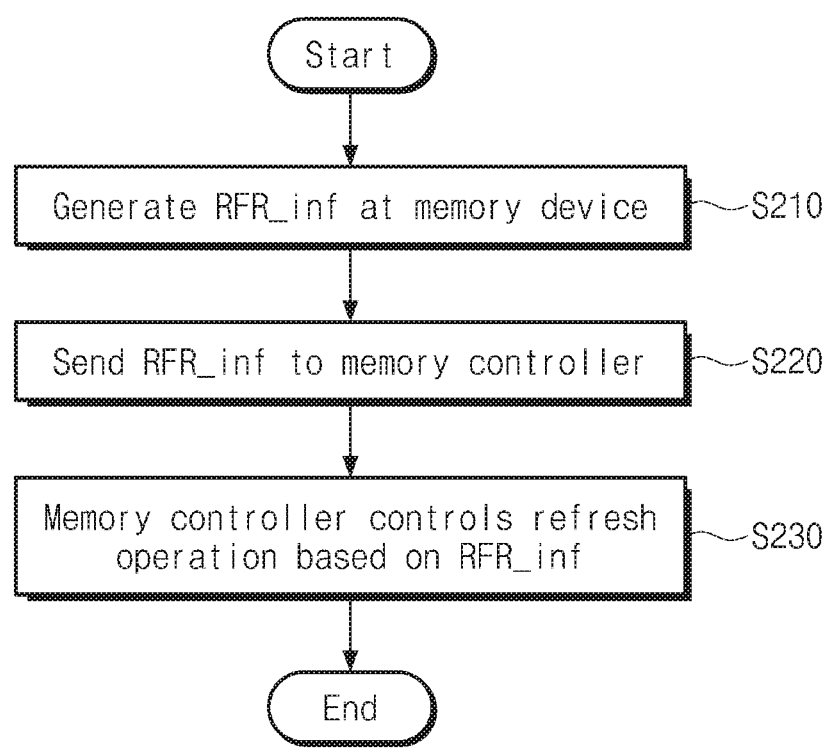
FIG. 12 is a flowchart illustrating an operation of an electronic device of FIG. 1 according to some example embodiments of inventive concepts.

FIG. 12 is a flowchart illustrating an operation of an electronic device of FIG. 1 according to some example embodiments of inventive concepts. Referring to FIG. 12, the memory controller 50 may control the refresh operation of the memory device 100 based on the refresh information RFR_inf received from the memory device 100.

In operation S210, refresh controller 160 may generate refresh information RFR_inf based on a performance indicator of the hidden refresh operation or performance indicators of the hidden and regular refresh operations during a first part of the reference time. For example, with regard to a corresponding reference time, the memory device 100 may generate the execution count by counting a regular refresh execution frequency and a hidden refresh execution frequency and generates the refresh information RFR_inf based on the execution count. For example, as described with reference to FIGS. 1 to 11, the refresh information RFR_inf may include the execution count, the hidden refresh execution count, or the refresh end flag. However, inventive concepts are not limited thereto.

In operation S220, the memory device 100 provides the refresh information RFR_inf to the memory controller 50 in response to a request of the memory controller 50. In operation S230, the memory controller 50 may control the refresh operation of the memory device 100 corresponding to the remaining part of the reference time based on the refresh information RFR_inf. The refresh manager 56 of the memory controller 50 may schedule the regular refresh operation a desired number of times during a remaining part of the reference time based on the refresh information RFR_inf. The refresh manager 56 may control the volatile memory device 100 to perform the regular refresh operation according to the schedule. The desired number of times for performing the regular refresh operation may be based on a difference between a reference value (or target number of refresh operations) and performance indicators (e.g., count values) of the hidden refresh operation and the regular refresh operation performed during the first part of the reference time, respectively. The desired number of the regular refresh operation may also be based on a performance indicator (e.g., count value) of a refresh operation for a special purpose. The refresh manager 56 may update the schedule if the refresh information RFR_inf is updated and provided to the memory controller 50. The refresh manager 56 may control the volatile memory device so the volatile memory device 100 performs a target number of refresh operations during the reference time, and the target number of refresh operations may correspond to a sum of the number of times the volatile memory device 100 performs the regular refresh operation, hidden refresh operation, and optionally a refresh operation for a special purpose during the reference time. Operation S230 will be described in detail with reference to FIG. 13.

Figure 13:
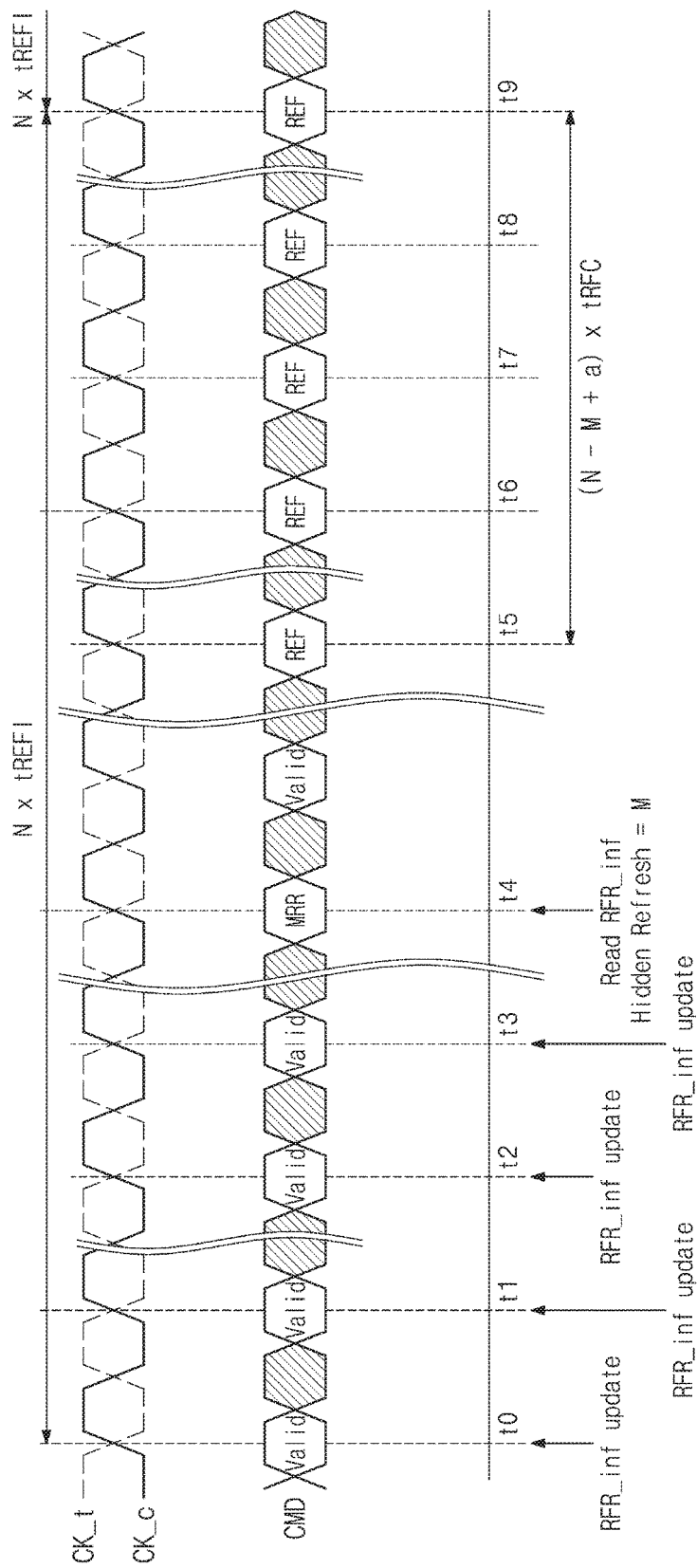
FIG. 13 is a timing diagram illustrating an operation of an electronic device of FIG. 1 according to some example embodiments of inventive concepts.

FIG. 13 is a timing diagram illustrating an operation of an electronic device of FIG. 1 according to some example embodiments of inventive concepts. FIG. 13 will be described with reference to FIGS. 1, 2, and 9. Definitions of a reference time corresponding to "N" regular refresh execution periods (N×tREFI), the refresh command REF, the valid command Valid, the regular refresh execution period tREFI, and the refresh execution time tRFC are the same as those described with reference to FIG. 9, and a description thereof is thus omitted. In an example of FIG. 13, it is assumed that the refresh operation of the memory device 100 is performed at the last time point of the reference time because "N" regular refresh operations are postponed. As in that described in FIG. 11, also, it is assumed that the refresh demand count RFR_dnd is "N" and N may be considered the target number of refresh operations.

During a time period between t0 and t3, the memory device 100 performs a plurality of hidden refresh operations in response to the valid commands Valid. As the hidden refresh operations are performed, the refresh information RFR_inf is updated. At t4, the memory controller 50 may provide a multi-purpose register read command MRR to the memory device 100. The multi-purpose register read command MRR may include a mode register set (MRS) command and an address command defined by the JEDEC standard. However, this is less associated with example embodiments of inventive concepts, and a description thereof is thus omitted. The memory controller 50 may be provided with the refresh information RFR_inf stored in the multi-purpose register 195 through the multi-purpose register read command MRR. Here, it is assumed that the memory device 100 performs "M" hidden refresh operations until t4. On the basis of the refresh information RFR_inf, the memory controller 50 may determine that the memory device 100 performs "M" hidden refresh operations. In other words, a performance indicator of the hidden refresh operation may include a refresh metric (e.g., count value) that corresponds to the number of times the hidden refresh operation is performed during a first part (e.g., t0 to t4) of the reference time.

During a time period between t5 and t9, the memory controller 50 may control a schedule of the refresh operation for the memory device 100 such that the refresh operation is performed "N−M+a" times. In this case, the memory controller 50 may control the memory device such that the hidden refresh operation is suspended during a time period between t5 and t9. Hence, the memory controller 50 may not provide the valid command Valid to the memory device 100 during a time of "(N−M+a)×tRFC" needed to perform the refresh operation "N−M+a" times. The time of "(N−M+a)× tRFC" is illustrated in FIG. 13 as corresponding to a time from t5 to t9.

Here, "a" refers to the number of refresh operations for a special purpose, which are distinguished from the hidden refresh operation and the regular refresh operation. For example, the special purpose is a purpose for improving the data reliability of memory cells connected to a specific word line. "a" may include "0" and a natural number. That is, in the case where the "a" is "0", the memory controller 50 may control the memory device 100 such that the refresh operation is performed "N−M" times. Alternatively, in the case where "a" is a natural number, even though the memory device 100 performs "N" refresh operations from t0 to t5, the memory controller 50 may control the memory device 100 such that the refresh operation for a special purpose is additionally performed "a" times.

The memory controller 50 may generate a refresh command based on the refresh information RFR_inf. For example, if the memory device 100 sends the refresh information RFR_inf to the memory controller 50 at t5 in response to a request (e.g., multi-purpose register read command MRR) from the memory controller 50, the memory controller 50 may provide the refresh command REF to the memory device 100 (N−M) times. Thereafter, during a remaining part of the reference time (e.g., from t5 to t9), the memory device 100 may perform (N−M) regular refresh operations in response to the N-M refresh commands REF from the memory controller 50. Also, to perform "a" refresh operations, the memory controller 50 may provide the memory device 100 with the refresh command REF "a" times or may provide the memory device 100 with a separate refresh command distinguished from the refresh command REF.

In other words, the memory controller 50 is provided with a hidden refresh execution frequency and provides the memory device 100 with the refresh command by a frequency except the hidden refresh execution frequency. Also, the memory controller 50 may control the memory device 100 such that the refresh operation is performed by the number of times that a refresh operation for the special purpose is performed. With the above description, the memory controller 50 may provide the valid command Valid to the memory device 100 during a time of "M×tRFC", thereby increasing the command efficiency. The command efficiency may be defined as a ratio of number of valid command Valid among the total number of commands which the memory device 100 received from the memory controller 50.

At t5, if the count value of hidden refresh operations M is equal to a threshold value (e.g., a value of N minus "a"), the refresh controller 160 may limit and/or prevent the volatile memory device from performing an additional hidden refresh operation during the remaining part of the reference time (e.g., t5 to t9).

Figure 14:
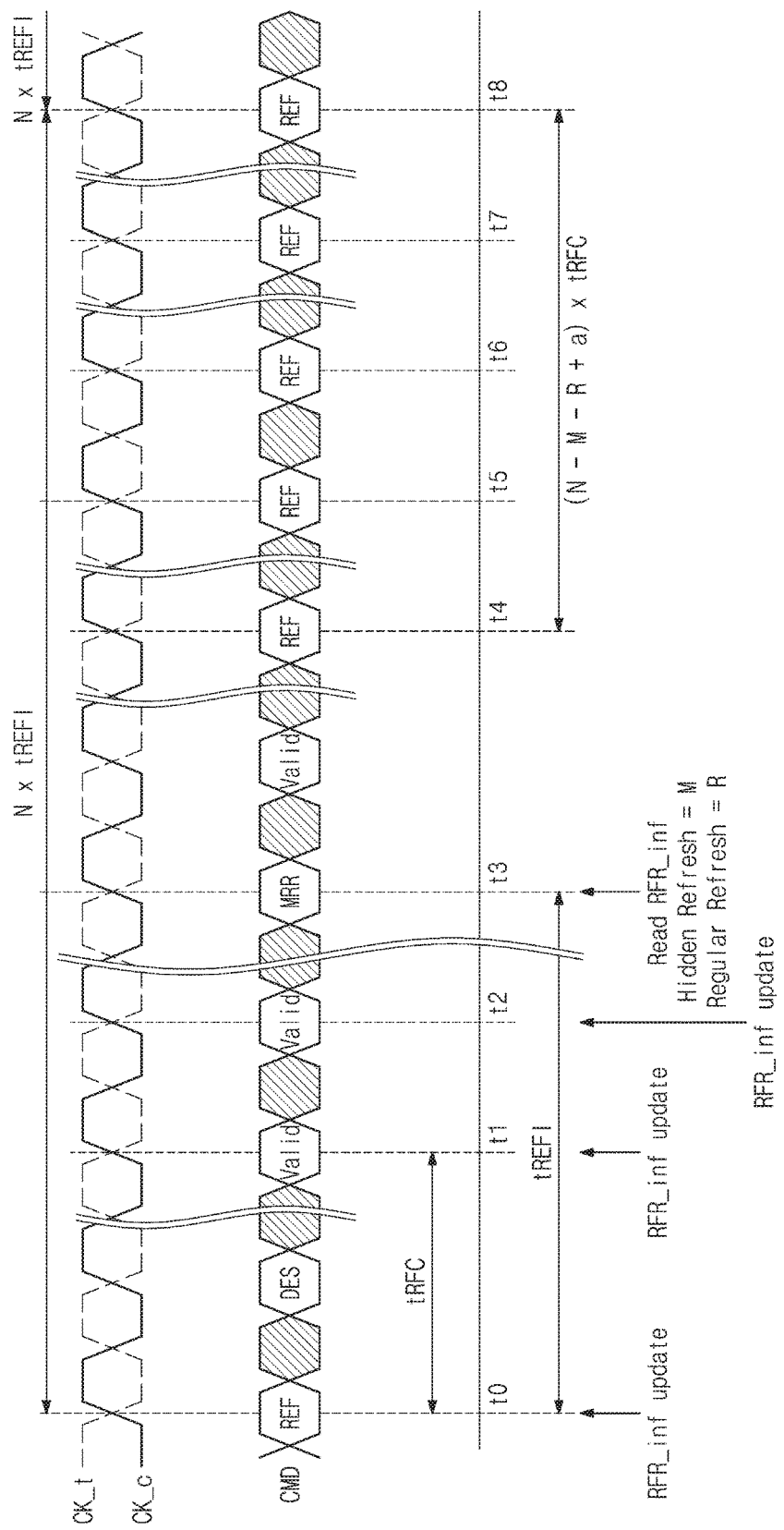
FIG. 14 is a timing diagram illustrating an operation of an electronic device of FIG. 1 according to some example embodiments of inventive concepts.

FIG. 14 is a timing diagram illustrating an operation of an electronic device of FIG. 1 according to some example embodiments of inventive concepts. FIG. 14 is the same as (or similar to) the timing diagram discussed in FIG. 13, except for the following differences.

Referring to FIG. 14, at t0, the memory device 100 receives the refresh command REF and performs the regular refresh operation. At times t1 and t2, the memory device 100 performs a plurality of hidden refresh operations in response to valid commands Valid. As the hidden refresh operations are performed, the refresh information RFR_inf is updated.

At t3, the memory controller 50 may provide a multi-purpose register read command MRR to the memory device 100. The memory device 100 may provide the refresh information RFR_inf to the memory controller 50 is response to the MRR command. Based on the refresh information RFR_inf, the memory controller 50 may determine the volatile memory device 100 performed R regular refresh operations and M hidden refresh operations during the part of the reference time t0 to t3. During a time period between t4 and t8, the memory controller 50 may control a schedule of the refresh operation for the memory device 100 such that the refresh operation is performed "N−M−R+a" times. For example, from t4 to t8, the memory controller 50 may provide the refresh command to the memory device 100 (N−M−R+a) times and the memory device 100 may perform the regular refresh operation in response to the refresh commands. Also, like the timing diagram in FIG. 13, "a" refers to the number of refresh operations for a special purpose, and the hidden refresh operation may be suspended during the period from t4 to t8.

Figure 15:
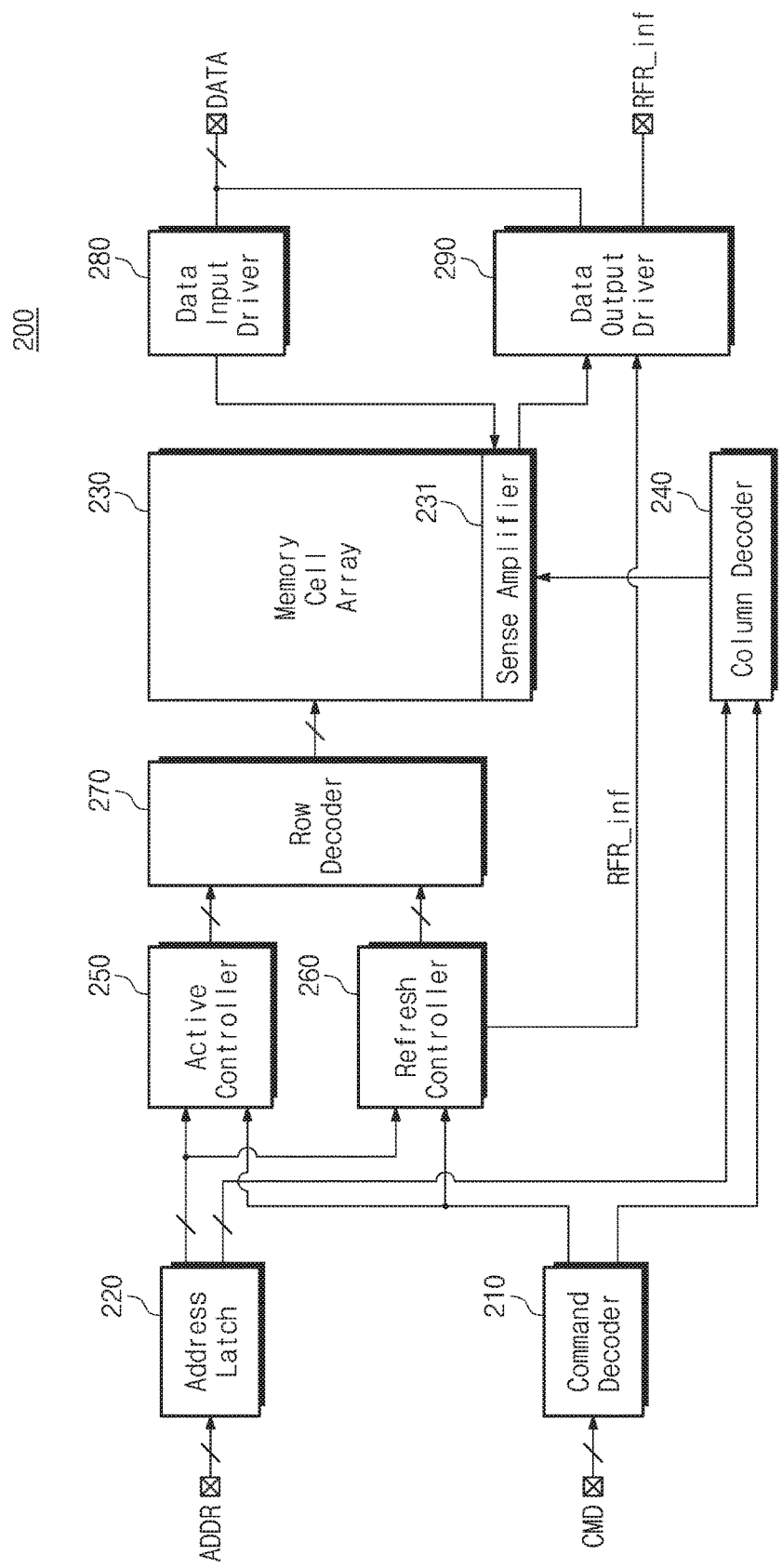
FIG. 15 is a block diagram illustrating a memory device according to some example embodiments of inventive concepts.

FIG. 15 is a block diagram illustrating a memory device according to some example embodiments of inventive concepts. Referring to FIG. 15, a memory device 200 includes a command decoder 210, an address latch 220, a memory cell array 230, a sense amplifier 231, a column decoder 240, an active controller 250, a refresh controller 260, a row decoder 270, and a data input driver 280, a data output driver 290. The memory device 200 of FIG. 15 is substantially the same as the memory device 100 of FIG. 2 except the memory device 200 does not include the multi-purpose register 195, and a description thereof is thus omitted.

The memory device 200 of FIG. 15 includes a dedicated pad RFR_inf for providing the refresh information RFR_inf to the memory controller 50. The memory device 200 may provide the refresh information RFR_inf to the memory controller 50 in real time through the dedicated pad. In this case, the memory controller 50 may include a register for storing the refresh information RFR_inf.

Figure 16:
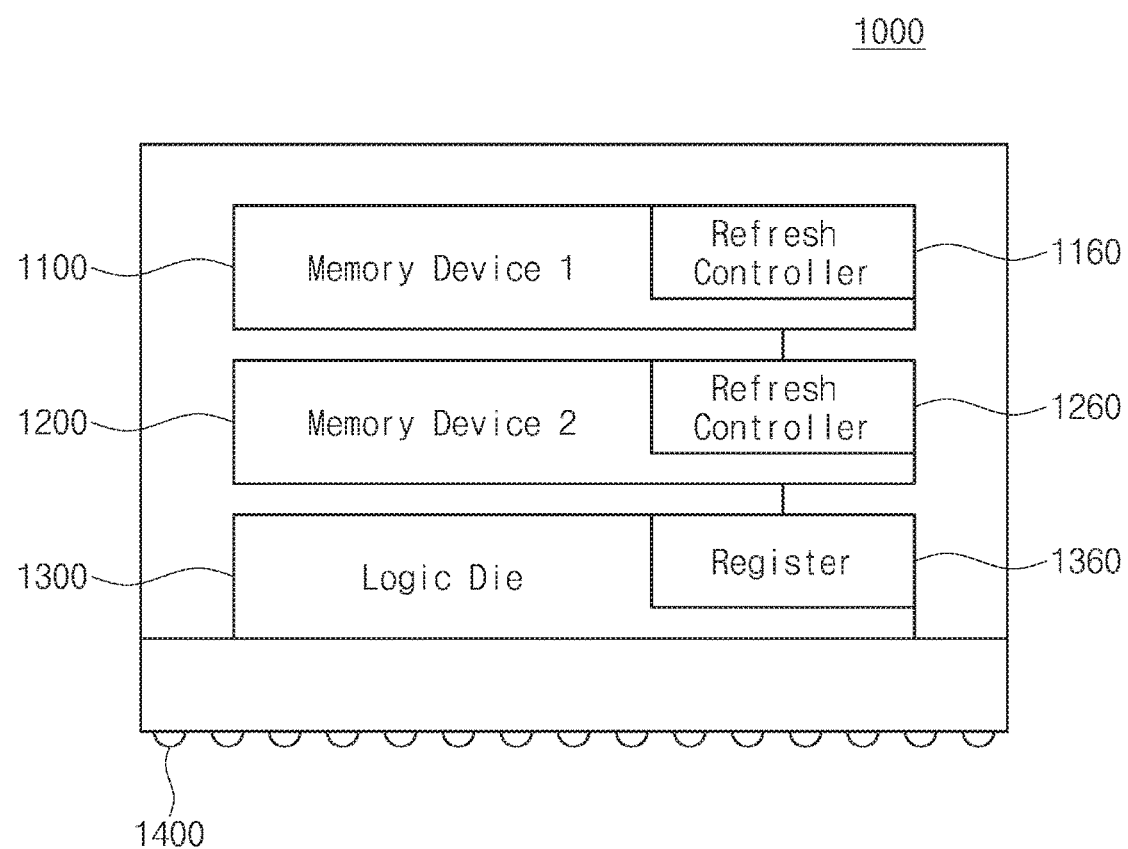
FIG. 16 is a block diagram illustrating a stacked memory device to which a memory device according to some example embodiments of inventive concepts is applied.

FIG. 16 is a block diagram illustrating a stacked memory device to which a memory device according to some example embodiments of inventive concepts is applied. Referring to FIG. 16, a stacked memory device 1000 may include first and second memory devices 1100 and 1200, a logic die 1300, and solder balls 1400. The number of stacked memory devices is not limited to that illustrated in FIG. 16.

Each of the first and second memory devices 1100 and 1200 may include the memory device 100/200 described with reference to FIGS. 1 to 15. Accordingly, the first and second memory devices 1100 and 1200 may include refresh controllers 1160 and 1260, respectively. The first and second memory devices 1100 and 1120 may be embodied based on either one of the memory devices 100 and 200 described with reference to FIGS. 1 to 15. Each of the refresh controllers 1160 and 1260 may include either one of the refresh controllers 160/260 described with reference to FIGS. 1 to 15. The first and second memory devices 1100 and 1200 may be connected to each other through silicon vias (TSVs). Also, the first and second memory devices 1100 and 1200 may be connected to the logic die 1300 through the TSVs.

The logic die 1300 may include a register 1360. Although not illustrated, the logic die 1300 may further include the memory controller 50 described in FIG. 1. The register 1360 may store refresh information provided from each of the first and second memory devices 1100 and 1200 that are connected to each other through the TSVs. Also, in response to a request of a host, the logic die 1300 may provide the host with refresh information stored in the register 1360 through an input/output pad (not illustrated) and the solder ball(s) 1400. With the above-described configuration, the host may be provided with refresh information about the first and second memory devices by one command, thereby improving the efficiency in which the refresh information is managed.

A structure of memory devices stacked by the TSVs is illustrated in FIG. 15 as an example of the stacked memory device 1000. However, inventive concepts are not limited thereto. It is easily understood that the example of FIG. 15 is applied to all stackable memory forms including a package on package (PoP) as well as the TSV.

Figure 17:
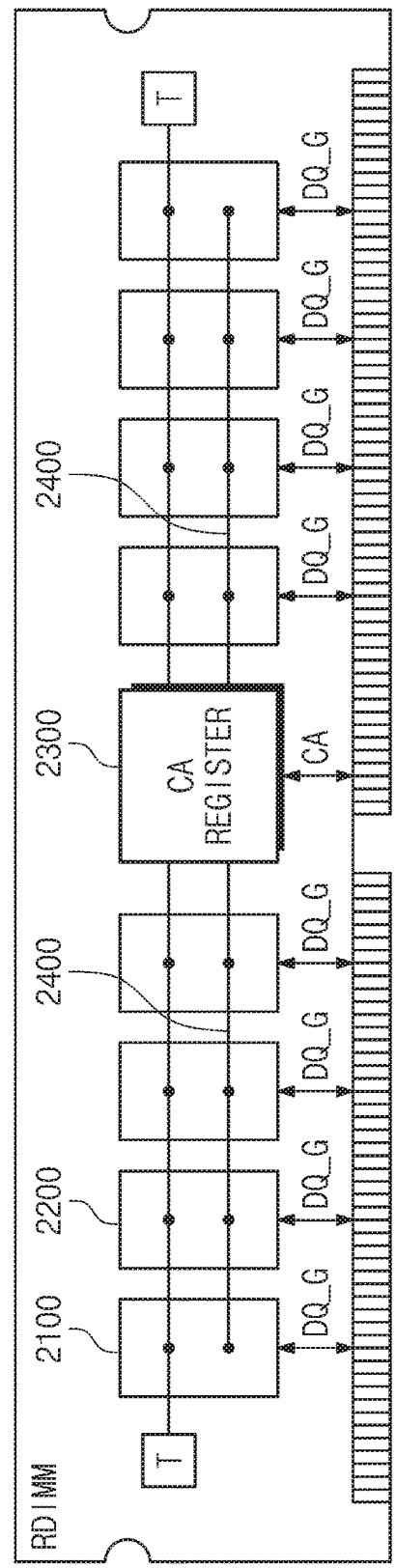
FIGS. 17 and 18 are drawings illustrating a memory module according to some example embodiments of inventive concepts.
Figure 18:
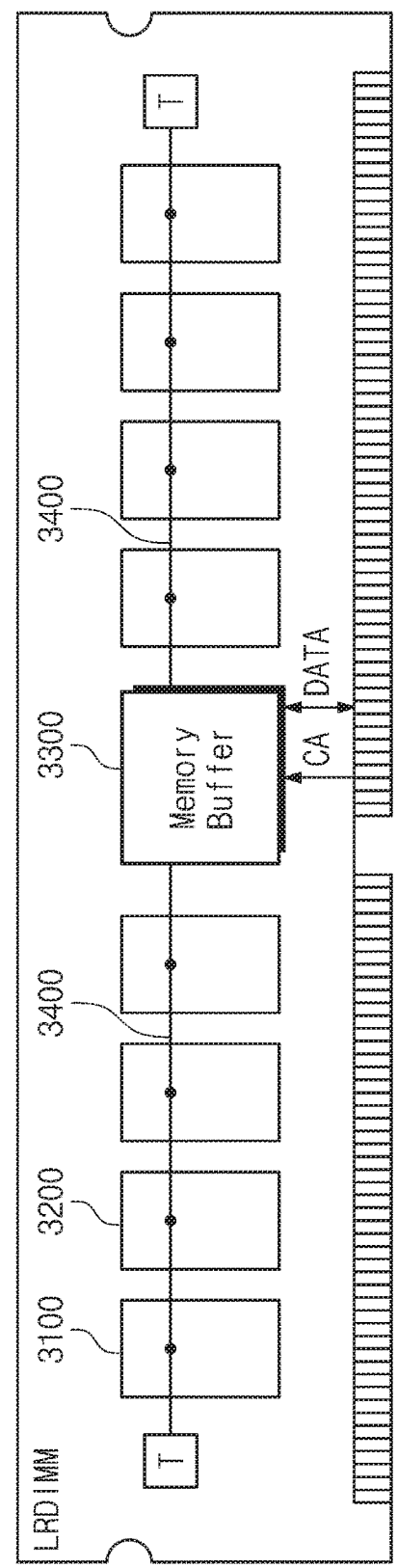

FIGS. 17 and 18 are drawings illustrating a memory module according to some example embodiments of inventive concepts.

Memory modules 2000 and 3000 illustrated in FIGS. 17 and 18 have a dual in-line memory module (DIMM) structure. Each of the memory modules 2000 and 3000 may include a plurality of memory devices 100 or a plurality of memory devices 200 described with reference to FIGS. 1 to 15 or the stacked memory device 1000 described with reference to FIG. 16. However, for ease of description, first and second memory devices of the plurality of memory devices will be described as an example. Memory modules 2000 and 3000 may include a termination resistor T on transmission line for command/address CA signals.

An A-type memory module 2000 having the RDIMM form is illustrated in FIG. 17. The A-type memory module 2000 may include first and second memory devices 2100 and 2200, a CA register 2300, and a refresh information transmission line 2400. The first and second memory devices 2100 and 2200 are connected with the CA register 2300. To reduce the load of an output part of a host, the CA register 2300 may perform a role of buffering a clock or an address to be sent from the host (and/or memory controller) to the first and second memory devices 2100 and 2200.

In the RDIMM structure, in the case where the memory controller accesses the first and second memory devices 2100 and 2200, the memory controller may directly exchange data with each of the first and second memory devices 2100 and 2200 through an independent transmission line DQ_G. In contrast, the memory controller may provide an address or a command to each of the first and second memory devices 2100 and 2200 through the CA register 2300.

The CA register 2300 may store refresh information provided from each of the first and second memory devices 2100 and 2200 connected through the refresh information transmission line 2400. Also, in response to a request of the host, the CA register 2300 provides stored refresh information to the memory controller through a command/address transmission line CA. In some example embodiments, the command/address transmission line CA may be bidirectional. With the above-described configuration, the memory controller may be provided with refresh information about the first and second memory devices 2100 and 2200 by one command, thereby making it easy to manage the refresh information. The memory controller may provide the refresh information and data retrieved from the first and second memory devices 2100 and 2200 to the host. The memory controller may provide an address or a command to the first and second memory devices 2100 and 2200 in response to a request from the host. Alternatively, the memory controller may be a portion of the host.

A B-type memory module 3000 having the LRDIMM form is illustrated in FIG. 18. The B-type memory module 3000 may include first and second memory devices 3100 and 3200, a memory buffer 3300, and a transmission line 3400. The first and second memory devices 3100 and 3200 are connected with the memory buffer 3400 through the transmission line 3400. The memory buffer 3300 performs a role of reducing the load of the output part of the memory controller.

In the LRDIMM structure, in the case where the memory controller accesses the first and second memory devices 3100 and 3200, the memory controller indirectly exchanges data, a command, and an address with the first and second memory devices 3100 and 3200 through the memory buffer 3300 and the transmission line 3400.

The memory buffer 3300 may store refresh information provided from each of the first and second memory devices 3100 and 3200 connected through the transmission line 3400. Also, in response to a request of the host (and/or memory controller), the memory buffer 3300 provides stored refresh information to the host through a data transmission line DATA. With the above-described configuration, the memory controller may be provided with refresh information about the first and second memory devices 3100 and 3200 by one command, thereby making it easy to manage the refresh information. As described above, the refresh information RFR_inf, a value stored in the CA register 2300 of FIG. 17, and a value stored in the memory buffer 3300 of FIG. 18 may be reset by a reset command that is provided from the memory controller randomly or periodically. The memory controller may provide the refresh information and data retrieved from the first and second memory devices 3100 and 3200 to the host. The memory controller may provide an address or a command to the first and second memory devices 3100 and 3200 in response to a request from the host. Alternatively, the memory controller may be a portion of the host.

Figure 19:
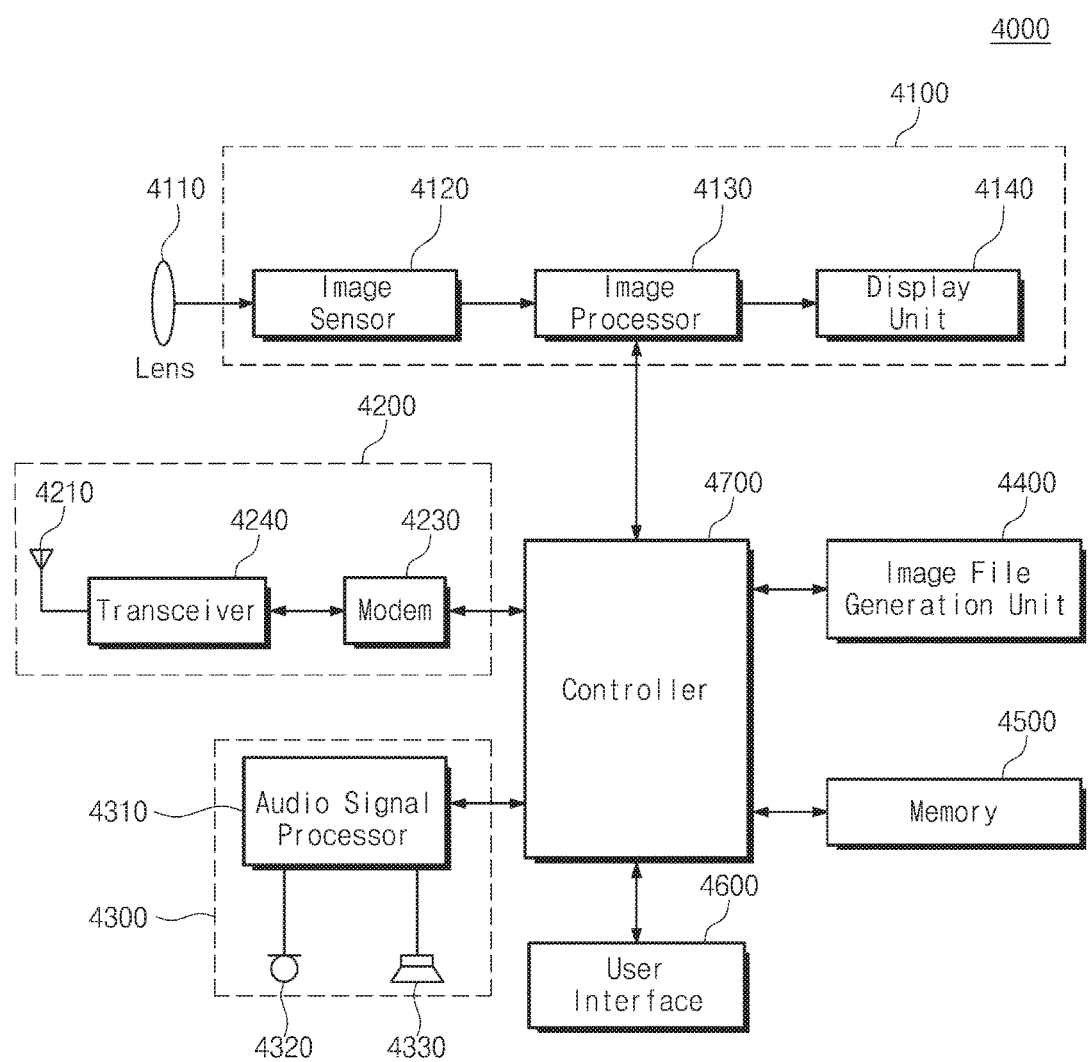
FIG. 19 is a block diagram illustrating a user system to which a memory device or a memory module according to some example embodiments of inventive concepts is applied.

FIG. 19 is a block diagram illustrating a user system to which a memory device or a memory module according to some example embodiments of inventive concepts is applied. A user system 4000 may include an image processing unit 4100, a wireless transceiver unit 4200, an audio processing unit 4300, an image file generation unit 4400, a memory 4500, a user interface 4600, and a controller 4700.

The image processing unit 4100 may include an image sensor 4120, an image processor 4130, and a display unit 4140. The image processing unit 4100 may be connected to a lens 4110. The wireless transceiver unit 4200 includes an antenna 4210, a transceiver 4220, and a modulator/demodulator (modem) 4230. The audio processing unit 4300 includes an audio processor 4310, a microphone 4320, and a speaker 4330.

The memory 4500 may be implemented with a memory module (DIMM), a memory card (a multimedia card (MMC), an embedded MMC (eMMC), a secure digital (SD) card, a micro SD card, etc.), and the like. The controller 4700 may be implemented with a system on chip that drives an application program, an operating system, etc. The controller 4700 may include the image processor 4130 or the modem 4230.

The memory 4500 may be implemented with the memory device 100 or 200 including the refresh controller 160 or 260 described with reference to FIGS. 1 to 15. Alternatively, the memory 4500 may be implemented with the stacked memory device 1000 described with reference to FIG. 16 or the memory module 2000 or 3000 described with reference to FIG. 17 or 18. In this case, since the memory 4500 provides refresh information to the controller 4700, the controller 4700 may control a refresh command efficiently. The controller 4700 may include the memory controller 50 in FIG. 1.

According to some example embodiment of inventive concepts, it may be possible to limit and/or prevent a refresh operation from be performed unnecessarily and a refresh command from being generated unnecessarily. This may mean that the efficiency of controlling the refresh operation increases. In other words, the data processing efficiency of volatile memory and the memory module may be improved.

In some example embodiments, in a case where the memory controller is a portion of the host, the host may include a memory (not shown) for storing functions related to the memory controller, such that when the host executes the instructions of the memory, the processor circuit or one or more processors of the host are configured as a special-purpose processor circuit or processor(s) for performing the functions of the memory controller. Thus, in example embodiments, the memory controller (and/or host if the memory controller is a portion of the host) may improve the functioning of the memory device by improving efficiency of controlling the refresh operation.

While some example embodiments have been particularly shown and described, it will be understood by one of ordinary skill in the art that variations in form and detail may be made therein without departing from the spirit and scope of the claims.

What is claimed is:

1. A memory system, comprising:
 a volatile memory device including a refresh controller connected to memory cells,
 the volatile memory device being configured to perform a hidden refresh operation on a first portion of the memory cells while the volatile memory device performs a valid operation on a second portion of the memory cells,
 the refresh controller being configured to generate refresh information based on a number of times the volatile memory device performs the hidden refresh operation during a reference time,
 a memory controller connected to the volatile memory device,
 the memory controller being configured to control a schedule for a regular refresh operation based on the refresh information, and
 the memory controller being configured to control the volatile memory device to perform the regular refresh operation according to the schedule.

2. The memory system of claim 1, wherein
 the refresh controller is configured to update the refresh information if the volatile memory device performs at least one of the hidden refresh operation and the regular refresh operation, and
 the memory controller is configured to set the schedule for the regular refresh operation based on the updated refresh information so the volatile memory device performs a desired number of the regular refresh operation during a remaining portion of the reference time.

3. The memory system of claim 1, wherein
the volatile memory device is configured to send the refresh information to the memory controller in response to a request from the memory controller, and
the volatile memory device is configured to send the refresh information to the memory controller based on a characteristic of the refresh information.

4. The memory system of claim 1, wherein
the memory controller is configured to control the volatile memory device so the volatile memory device performs a target number of refresh operations during the reference time, and
the target number of refresh operations corresponds to a sum of a number of times of the volatile memory device performs the regular refresh operation during the reference time and the number of times the volatile memory device performs the hidden refresh operation during the reference time.

5. The memory system of claim 4, wherein
the refresh controller is configured to prevent the volatile memory device from performing an additional hidden refresh operation during the reference time if the refresh controller determines a count value of the hidden refresh operation during the reference time is equal to a threshold value, and
the threshold value is less than the target number of refresh operations.

6. The memory system of claim 1, wherein
the refresh controller is configured to control the hidden refresh operation if the refresh controller receives an active address corresponding to the second portion of the memory cells and an active signal corresponding to the valid operation, and
the refresh controller is configured to control the hidden refresh operation without receiving a refresh command from the memory controller based on generating a refresh address that corresponds to the first portion of the memory cells and does not collide with the active address.

7. The memory system of claim 6, wherein
the refresh controller includes an address comparator, a refresh address generator, a logic gate, and a refresh information generator,
the refresh address generator is configured to generate a hidden refresh address based on a refresh active signal,
the address comparator is configured to generate a hidden refresh active signal based on the hidden refresh address and the active address,
the logic gate is configured to generate the refresh active signal based on performing a logical operation on a regular refresh active signal and the hidden refresh active signal, and
the refresh information generator is configured to generate the refresh information using the hidden refresh active signal.

8. The memory system of claim 6, wherein
the refresh controller includes a refresh counter that is configured to adjust the refresh information if the volatile memory device performs the hidden refresh operation, and
the refresh controller includes an oscillator that is configured to maintain a value of the refresh information if the volatile memory device performs a regular refresh operation.

9. The memory system of claim 1, wherein
the refresh controller is configured to generate the refresh information based on a sum of the number of times the volatile memory device performs the hidden refresh operation during a first part of the reference time and a number of times the volatile memory device performs the regular refresh operation during the first part of the reference time.

10. The memory system of claim 1, wherein
the refresh controller is configured to prevent the volatile memory device from performing an additional hidden refresh operation or an additional regular refresh operation during the reference time if the refresh controller determines a sum of a count value of the hidden refresh operation and a count value of the regular refresh operation during the reference time is greater than or equal to a threshold value.

11. The memory system of claim 1, wherein the volatile memory includes a register configured to store the refresh information.

12. The memory system of claim 1, wherein the volatile memory includes a dedicated pad for providing the refresh information to the memory controller.

13. The memory system of claim 1, wherein
the memory controller is configured to generate a reset command and send the reset command to the volatile memory if a time interval corresponding to the reference time ends,
the refresh controller of the volatile memory device is configured to reset the refresh information to a base value in response to the reset command, and
the refresh controller is configured to update the refresh information based on a number of times the volatile memory device performs the hidden refresh operation during a new reference time.

14. The memory system of claim 1, wherein
the refresh controller is configured to update the refresh information based on a count value of the hidden refresh operation during a first part of the reference time, and
the memory controller is configured to set the schedule for the regular refresh operation based on the updated refresh information so the volatile memory device performs a desired number of the regular refresh operation during a remaining portion of the reference time.

15. A memory system, comprising:
a volatile memory device including a refresh controller connected to memory cells,
the volatile memory device being configured to perform a hidden refresh operation on a first portion of the memory cells while the volatile memory device performs a valid operation on a second portion of the memory cells,
the refresh controller being configured to generate refresh information based on a number of times the volatile memory device performs the hidden refresh operation during a reference time; and
a memory controller connected to the volatile memory device, the memory controller being configured to generate a refresh command based on the refresh information to perform a regular refresh operation in the volatile memory device.

16. A method of operating a memory system including a volatile memory device connected to a memory controller, the volatile memory device including memory cells connected to a refresh controller, the method comprising:

performing a first refresh operation on a first portion of the memory cells and a valid operation on a second portion of the memory cells at least one time during a first part of a reference time;

generating refresh information using the refresh controller based on a performance indicator of the first refresh operation during the first part of the reference time;

providing the refresh information to the memory controller;

using the memory controller to schedule a second refresh operation a desired number of times during a remaining part of the reference time, based on the refresh information; and performing the second refresh operation on the volatile memory device during the remaining part of the reference time according to the schedule.

17. The method of claim 16, wherein the generating refresh information includes generating the refresh information using the refresh controller based on the performance indicator of the first refresh operation and a performance indicator of the second refresh operation during the first part of the reference time, the performance indicator of the first refresh operation corresponds to a count value of the first refresh operation during the first part of the reference time, and the performance indicator of the second refresh operation corresponds to a count value of the second refresh operation during the first part of the reference time.

18. The method of claim 17, further comprising:

updating the refresh information using the refresh controller if the volatile memory device performs at least one of the first refresh operation and the second refresh operation during the reference time after the first part of the reference time;

using the memory controller to update the schedule for the second refresh operation based on the updated refresh information; and performing the second refresh operation during the remaining part of the reference time according to the updated schedule.

19. The method of claim 16, wherein the first refresh operation is a hidden refresh operation that the volatile memory device is configured to perform without receiving a refresh command from the memory controller, the second refresh operation is a regular refresh operation that the volatile memory device is configured to perform in response to receiving the refresh command from the memory controller, and the first and second portions of the memory cells are in mats that are not adjacent to each other.

20. The method of claim 16, further comprising:

generating a refresh stop flag using the refresh controller if a value of the refresh information equals a threshold value, wherein the refresh stop flag prevents the volatile memory device from performing another first refresh operation or another second refresh operation during the remaining part of the reference time.

* * * * *